United States Patent
Kim et al.

(10) Patent No.: US 7,737,445 B2
(45) Date of Patent: Jun. 15, 2010

(54) CONTACT PORTION OF SEMICONDUCTOR DEVICE, AND THIN FILM TRANSISTOR ARRAY PANEL FOR DISPLAY DEVICE INCLUDING THE CONTACT PORTION

(75) Inventors: Bo Sung Kim, Seoul (KR);
Kwan-Wook Jung, Suwon (KR);
Wan-Shick Hong, Seoul (KR);
Sang-Gab Kim, Seoul (KR); Mun-Pyo Hong, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/030,992

(22) Filed: Feb. 14, 2008

(65) Prior Publication Data

US 2008/0145980 A1 Jun. 19, 2008

Related U.S. Application Data

(60) Continuation of application No. 11/359,138, filed on Feb. 22, 2006, now Pat. No. 7,358,104, which is a division of application No. 10/466,299, filed as application No. PCT/KR02/01878 on Oct. 8, 2002, now Pat. No. 7,061,015.

(30) Foreign Application Priority Data

Nov. 12, 2001 (KR) ............... 2001-70043

(51) Int. Cl.
*H01L 29/04* (2006.01)
(52) U.S. Cl. ............. 257/59; 438/149; 257/E27.116
(58) Field of Classification Search ........... 257/59, 257/72, E27.116, E29.117, E29.147; 438/30, 438/151, 149, 609
See application file for complete search history.

(56) References Cited

U.S. PATENT DOCUMENTS

| 5,432,108 | A | 7/1995 | Lee |
| 5,784,131 | A | 7/1998 | Kim et al. |
| 6,001,539 | A | 12/1999 | Lyu et al. |
| 6,088,071 | A | 7/2000 | Yamamoto et al. |
| 6,207,971 | B1 * | 3/2001 | Jinno et al. ............ 257/72 |
| 6,228,747 | B1 | 5/2001 | Joyner |
| 6,307,611 | B1 * | 10/2001 | Kim et al. ............ 349/138 |
| 6,338,989 | B1 | 1/2002 | Ahn et al. |
| 6,620,655 | B2 * | 9/2003 | Ha et al. ............ 438/149 |
| 6,674,495 | B1 | 1/2004 | Hong et al. |
| 2001/0032981 | A1 | 10/2001 | Kong et al. |

FOREIGN PATENT DOCUMENTS

| CN | 1290922 A | 4/2001 |
| JP | 02028923 | 1/1990 |

(Continued)

*Primary Examiner*—David Vu
(74) *Attorney, Agent, or Firm*—Cantor Colburn LLP

(57) ABSTRACT

A method for manufacturing a semiconductor device including forming a first wire on a substrate, forming a lower film on the first wire, forming a photosensitive pattern on the lower film using a photosensitive material, forming contact holes for exposing the first wire by etching the lower film using the photosensitive film as an etching mask, removing part of the photosensitive film pattern by an ashing process to expose a borderline of the lower film defining the contact holes and forming second wire connected to the first wire via the contact holes.

6 Claims, 41 Drawing Sheets

FOREIGN PATENT DOCUMENTS

| | | |
|---|---|---|
| JP | 03042871 | 2/1991 |
| JP | 03265168 | 11/1991 |
| JP | 08107143 | 4/1996 |
| JP | 9-8131 | 1/1997 |
| JP | 10041519 | 2/1998 |
| JP | 10092926 | 4/1998 |
| JP | 11-153808 | 6/1999 |
| JP | 2000-183040 | 6/2000 |
| JP | 2000347173 | 12/2000 |
| JP | 2001-033826 A | 2/2001 |
| JP | 2001-230321 A | 8/2001 |
| JP | 8-78523 | 2/2008 |
| KR | 10-2001-0016713 | 3/2001 |

\* cited by examiner

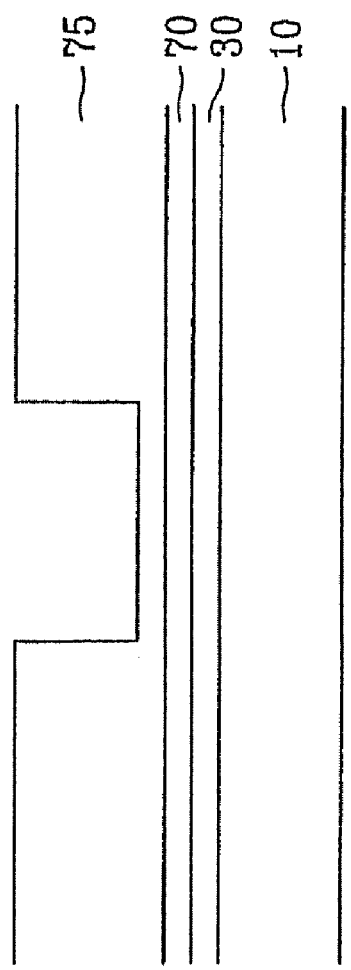

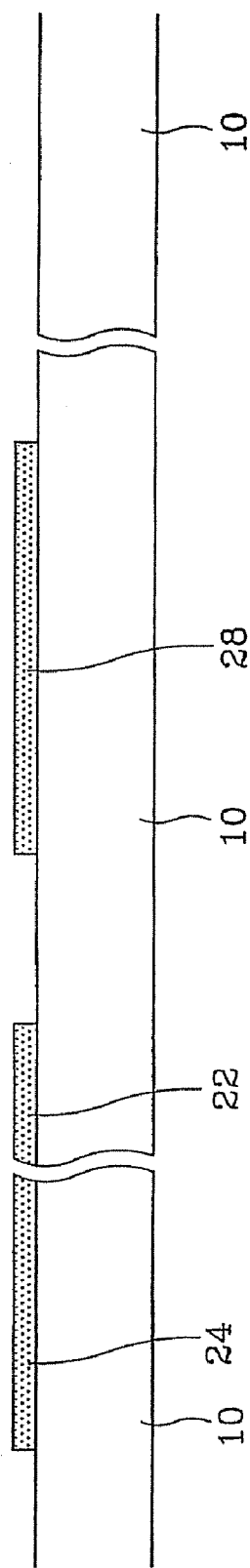

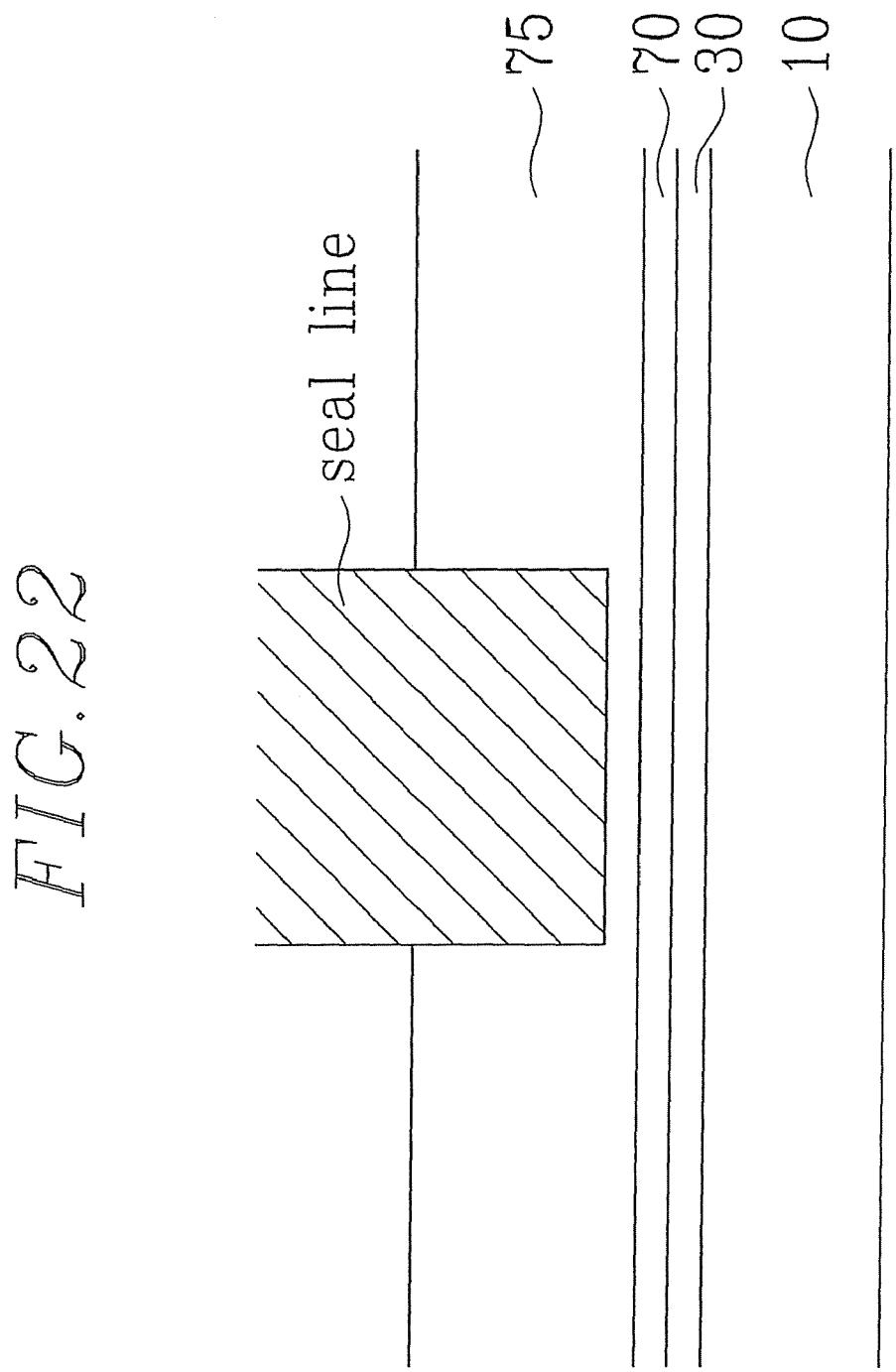

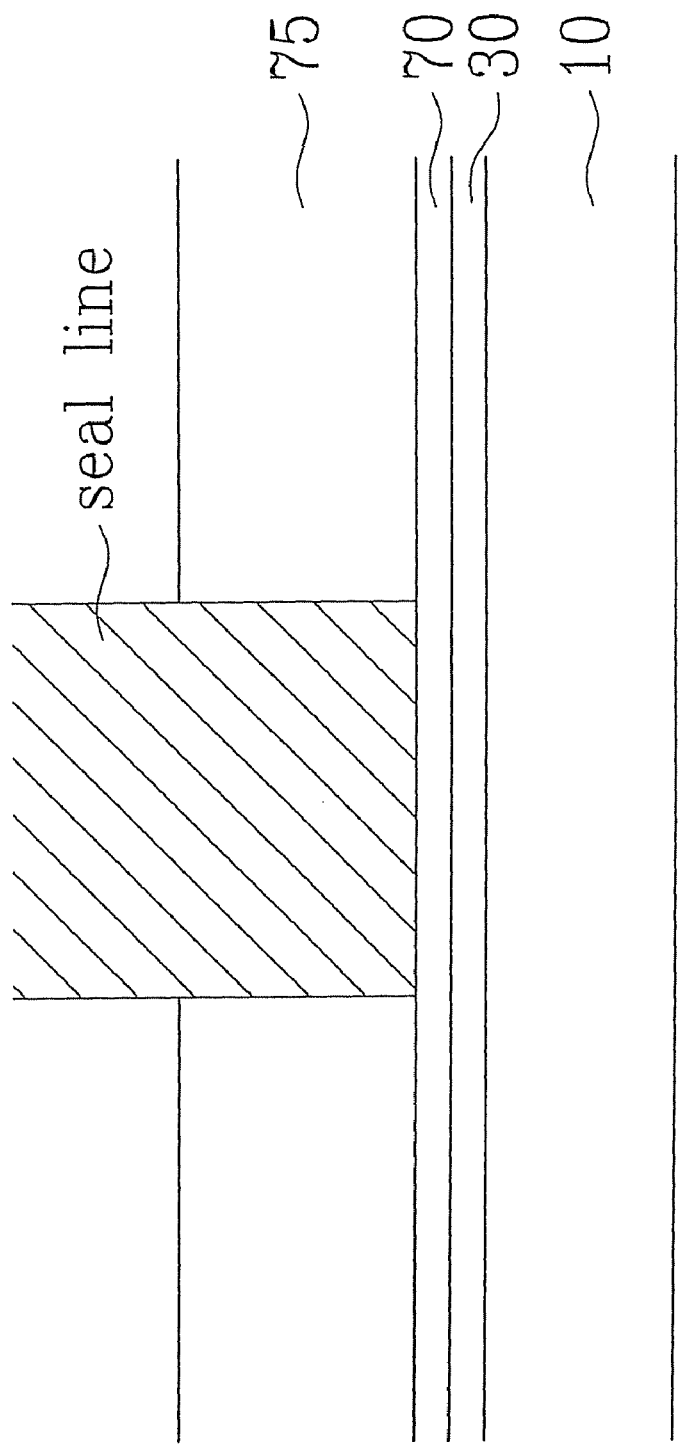

CONTACT PORTION OF SEMICONDUCTOR DEVICE, AND THIN FILM TRANSISTOR ARRAY PANEL FOR DISPLAY DEVICE INCLUDING THE CONTACT PORTION

The present application is a continuation application of U.S. patent application Ser. No. 11/359,138 filed on Feb. 22, 2006, which is a divisional application of U.S. patent application Ser. No. 10/466,299 filed on Aug. 1, 2003 and issued as U.S. Pat. No. 7,061,015, which is an application filed under 35 U.S.C. §371 and hereby claims the benefit of International Patent Application No. PCT/KR02/01878 filed Oct. 8, 2002 designating the United States of America, which claims priority to and the benefit of Korean Patent Application No. 2001-70043 filed on Nov. 12, 2001. The above-listed U.S. and PCT applications are related to the present application and are herein incorporated by reference in their entirety.

BACKGROUND OF THE INVENTION (a) Field of the Invention

The present invention relates to a contact portion of semiconductor device and a method for manufacturing the same, and a thin film transistor array panel for display device including the contact portion and the method for manufacturing the same.

(b) Description of the Related Art

In general, it is preferable that, as a semiconductor device is more integrated, an area of the device is optimized and a wiring thereof is made of multi-layers. In this case, preferably, an interlayer insulating film is made of material with a low dielectric constant in order to minimize an interference of signals transferred through the wiring, and the wiring transferring the same signals has to be connected electrically by forming a contact hole in an insulating film. However, if an under-cut is generated on the contact portion on forming the contact hole by etching the insulating film, a step coverage of the contact portion becomes bad. This causes a problem that a profile of the wiring formed on the insulating film becomes bad or the wiring in the contact portion is disconnected.

In the meanwhile, a liquid crystal display (LCD) is one of flat panel display devices which are used most widely, and it is a display device that comprises two substrates on which electrodes are formed and a liquid crystal layer interposed therebetween, and that applying the electrodes makes the liquid crystal molecules in the liquid crystal layer rearranged, thereby adjusting amount of the light transmitted.

The mainly used LCDs are those that electrodes are formed on two substrates respectively and have a thin film transistor switching voltages applied to the electrodes.

In general, on the substrate where a thin film transistor is formed, wire including gate lines transmitting scanning signals and data lines transmitting data signals, and a gate pad and a data pad applied with the scanning signals and data lines from external devices to transmit the gate lines and the data lines respectively, are formed, and pixel electrodes electrically connected with the thin film transistor are formed on pixel areas defined by crossing the gate lines and the data lines.

Here, it is preferable that an aperture rate of the pixel is sure to be obtained in order to improve display features of the LCDs. For this, the wire and the pixel electrodes are made to overlap with each other, an insulating film made of organic material with a low dielectric constant is formed therebetween in order to minimize interferences of signals transmitted through the wire.

This method for manufacturing the thin film transistor array substrate for display device requires a process that exposes a pad for receiving signals from external devices or a process that exposes wire in order to be connected with each other. However, when a lower film is etched to form a contact hole thereon by using an insulating film having the contact hole as a mask, the lower film beneath the insulating film is severely under-cutted, and hence the step coverage of the contact portion becomes bad. This causes problems that the other upper films formed later become bad or the wire of the upper films are disconnected on the contact portion. To solve these problems, it is preferable that sidewalls of the contact holes in the contact portion are made to be step-shaped, however, since the organic insulating film must be patterned several times by a photo etching for this, it has a problems that its manufacturing process becomes complex.

In the meanwhile, a seal line attaching two substrates around the LCD panel and sealing liquid crystal material posed therebetween is formed, and a poor contact is generated if this seal line is formed on the organic insulating film.

SUMMARY OF THE INVENTION

An object of the present invention is to provide a contact portion of semiconductor device and a method for manufacturing the same, and a thin film transistor array panel and a method for manufacturing the same including the same capable of improving the profile of the contact portion.

In addition, another object of the present invention is to simplify a method for manufacturing a thin film transistor array panel.

Furthermore, another object of the present invention is to provide a thin film transistor array panel capable of removing the poor contact.

To solve these problems, in the present invention, when an organic insulating film having contact hole is formed, the periphery of the contact hole is formed thinner than the other portions. Next, the exposed lower film is etched using the organic insulating film as an etching mask to form contact hole thereon, and thereafter, the thin organic insulating film is removed by an ashing process to expose the lower film through the contact hole of the organic insulating film. Here, in case under-cut is left under the lower film, a process, which the lower film is etched using the organic insulating film as an etching mask, may be added.

More in detail, in the contact portion of the semiconductor device and the method for manufacturing the same according to the present invention, first, a first wiring is formed on the substrate, and the lower film covering the first wiring is formed. Next, a photosensitive film pattern is formed on the lower film using a photosensitive organic material, and the lower film is etched using the photosensitive film pattern as an etching mask, thereby forming the contact hole for exposing the first wiring. Then, part of the photosensitive film pattern is removed by an ashing process to expose borderline of the lower film defining the contact hole, and then a second wiring connected to the first wiring via the contact hole is formed.

The lower film may be formed of an insulating film made of SiNx or SiOx, or may be formed of a conducting film made of conducting material.

In addition, the lower film may be formed of a first insulating layer and a second insulating layer, in this case, it is preferable that, after exposing the borderline of the lower film, the second insulating film not blocked by the photosensitive film pattern is etched to expose the borderline of the first insulating film, wherein the second insulating film is formed of a low dielectric insulating film which has a low dielectric constant less than 4.0 and is formed by a chemical vapor deposition.

Here, it is preferable that the photosensitive film pattern around the contact hole is formed thinner than that in the other portions.

The contact portion of the semiconductor device and the manufacturing method thereof according to this present invention are equally applicable to a thin film transistor for liquid crystal display and a manufacturing method thereof.

First, in a manufacturing method of a thin film transistor array panel for liquid crystal display, gate wire, which include a gate line, a gate electrode connected to the gate line and a gate pad connected to one end of the gate line to transmit a scanning signal from a external device to the gate line, are formed on an insulating substrate. Next, after forming a gate insulating film and a semiconductor layer, data wire, which include a data line crossing with the gate line, a source electrode connected to the data line and adjacent to the gate electrode, a drain electrode placed opposite to the source electrode in relation to the gate electrode and a data pad connected to one end of the data line to transmit an image signal from an external device to the data line, are formed. Next, after depositing a insulating film and forming a photosensitive organic insulating film pattern, the insulating film is etched using the photosensitive organic insulating film pattern as an etching mask to form a first contact hole for exposing the gate pad or the data pad. Then, after exposing the borderline of the insulating film in the first contact hole by the ashing process, an assistant pad connected to the gate pad or the data pad via the first contact hole is formed.

It is preferable that the organic insulating pattern around the first contact hole is formed thinner than that in the other portions.

The insulating film may formed of a first insulating film and a second insulating film, in this case, it is preferable that after exposing the borderline of the insulating film, the second insulating film not blocked by the organic insulating film pattern, and then the organic insulating film is removed. Here, the second insulating film is a low dielectric insulating film which has a low dielectric constant less than 4.0 and is formed by a chemical vapor deposition.

Here, it is preferable that the organic insulating film has a second contact hole for exposing the drain electrode and a pixel electrode electrically connected to the drain electrode via the second contact hole is formed on the same layer as the assistant pad.

It is preferable that the second contact hole is formed with the first contact hole and the organic insulating film pattern around the second contact hole is formed thinner than that in the other portions.

The data wire and the semiconductor layer may be formed by a photo etching process using photosensitive patterns whose thickness is partly different.

BRIEF DESCRIPTION OF THE DRAWINGS

FIG. 5b is a cross-sectional view taken along Vb-Vb' shown in FIG. 5a.

FIG. 8c is a cross-sectional view showing an area where a seal line will be formed on the thin film transistor array panel for liquid crystal display according to the first embodiment.

FIG. 14b and FIG. 14c are cross-sectional views taken along X IVb-X IVb' and X IVc-X IVc' shown in FIG. 14a, respectively.

FIG. 22 is a cross-sectional view with a seal line according to FIG. 8C.

FIG. 23 is a cross-sectional view with a seal line according to FIG. 10b.

DETAILED DESCRIPTION OF THE PREFERRED EMBODIMENTS

A contact portion of semiconductor device and a method for manufacturing the same, and a thin film transistor array panel and a method for manufacturing the same including the contact portion of semiconductor device and the method for manufacturing the same according to embodiments of the present invention will be described in detain with reference to accompanying drawings so that those skilled in the art practice easily.

First, a contact portion and a method for manufacturing the same will be described according to an embodiment of the present invention.

In general, as a semiconductor device is more integrated, it is preferable that an area of thereof is made to be optimized or its wiring is formed of multi-layers for the purpose of assisting a pad connected to signal lines for receiving signals from external devices. A semiconductor device according to an embodiment of the present invention includes an interlayer insulating film with a low dielectric constant for the purpose of minimizing interferences of signals transferred through wire, and an organic film made of an organic material that a smoothing feature is excellent. Here, a contact hole needs to be formed on the insulating layer in order to electrically connect the wire between layers with each other, and when the interlayer insulating film is etched to form the contact hole, a manufacturing method according to an embodiment of the present invention makes a periphery of the contact hole of the organic insulating film thinner than the other portions thereof for the purpose of removing the under-cut generated in the contact portion. Next, a lower film is etched using the organic insulating film as a etching mask, and then an ashing process is performed to remove the thin insulating film, thereby exposing the lower film.

FIG. 1a to FIG. 1e are cross-sectional views showing a method for manufacturing a contact portion of a semiconductor device by a process order according to a first embodiment of the present invention, and FIG. 2a to FIG. 2d are cross-sectional views showing a method for manufacturing a contact portion of a semiconductor device by a process order according to a second embodiment of the present invention.

Figure 1A:
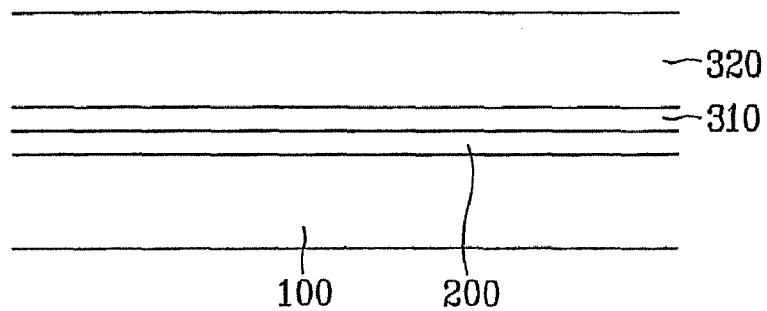
FIG. 1a to FIG. 1e are cross-sectional views showing a method for manufacturing a contact portion of a semiconductor device by a process order according to a first embodiment of the present invention.

In a manufacturing method of a contact portion of a semiconductor device according to the first embodiment of the present invention, as shown in FIG. 1a, first, a lower insulating film 310 made of SiNx or SiOx is deposited on a substrate 100 where a first wiring 200 is formed, and then, as an upper insulating film, an organic insulating film 320 with a low dielectric constant and made of a photosensitive organic material is coated thereon, thereby forming a interlayer insulating films 300.

Figure 1B:
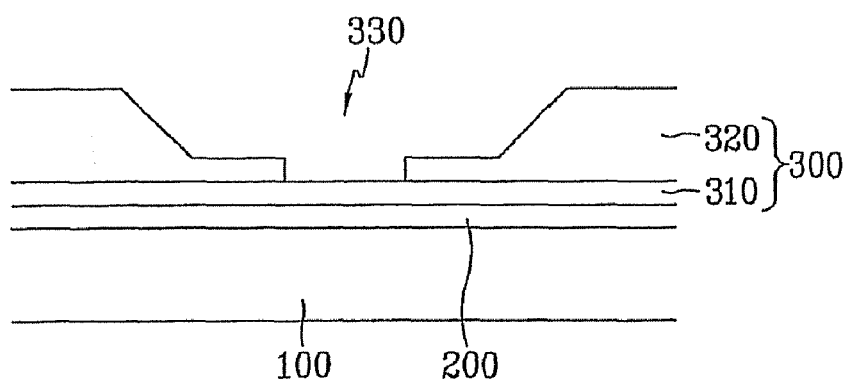

Next, as shown in FIG. 1b, a transmittance area is formed on a portion corresponding to a contact hole 330 in order to forming the contact hole 330 for exposing the first wiring 200, and for the purpose of adjusting a light transmittance, around the transmittance area, a slit or a lattice type pattern, is mainly formed, or the organic insulating film pattern, which is exposed and developed using a mask with a semi-transmittance area where a semi-transparent film is formed to have the contact hole 330 for exposing the lower insulating film 310 on the first wiring 200, is formed. In this regard, by exposing and developing the organic insulating film 320 using the mask with a semi-transmittance area, the organic insulating film 320 around the opening portion is left to be thinner than that in the other portions. This will be described in detail in a manufacturing method of a thin film transistor panel for liquid crystal display according to a fourth embodiment of the present invention which manufactures the thin film transistor for liquid crystal display using four masks. It is preferable that the thickness of the organic insulating film 320 around the contact hole 30 is not more than 2,000 Å in consideration of the thickness removed in the ashing process thereafter.

Figure 1C:
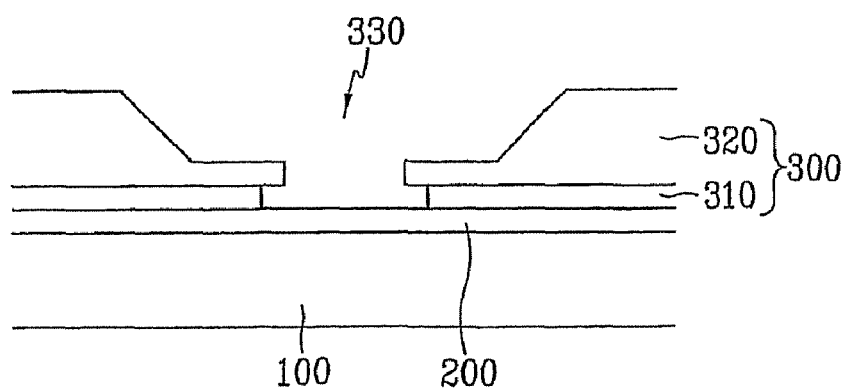

Then, as shown in FIG. 1c, the lower insulating film 310 exposed through the contact hole 330 is etched to expose the first wiring 200. Here, since reaction of an etching gas is performed isotropically in the process of etching even using a dry etching, let alone a wet etching, the lower insulating film 310 is etched to the organic insulating film pattern 320, and hence an under-cut is generated.

Figure 1D:
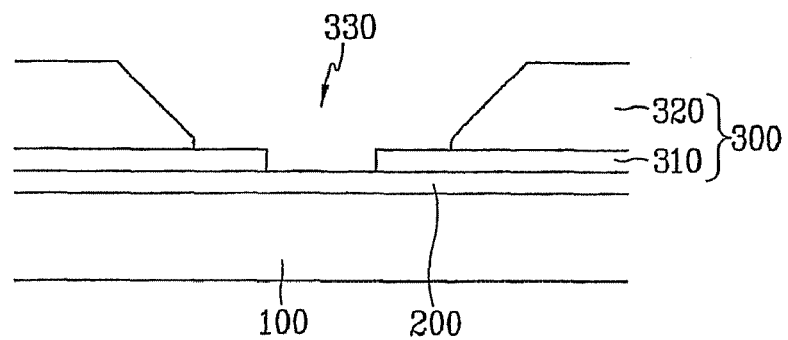

Next, as shown in FIG. 1d, an ashing process is performed to remove part of the organic insulating film pattern 320 which is a photosensitive film. The organic insulating film, which the periphery of the contact hole 330 is formed thinner than the other portions, is completely removed to make the border line of the lower insulating film be exposed.

Figure 1E:
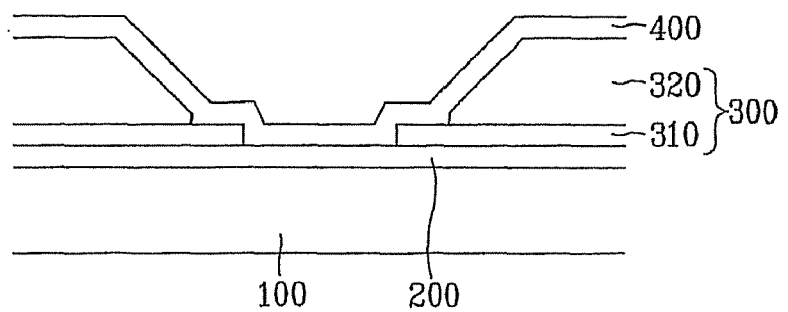

Then, as shown in FIG. 1e, a conducting material is deposited on the organic insulating film pattern 320, and patterned by a photo etching process using a mask, thereby forming a second wiring 400 electrically connected to the first wiring 200 via the contact hole 330.

In the contact portion of the semiconductor device and the manufacturing thereof according to the first embodiment of the present invention, when the interlayer insulating film is made of an organic material and the contact hole for exposing the first wiring 200 is formed, by forming the sidewall of the organic insulating film 320 step-shaped and performing the ashing process after etching the lower insulating film 310, the under-cut structure generated under the organic insulating film of the contact portion is removed. This can prevent the second wiring from disconnecting with the first wiring, and improve the profile of the second wiring 400 in the contact portion smooth.

Although the lower insulating film 310 under the organic insulating film 320 has been described as an example, this is equally applicable to case that a lower film of the organic insulating film 320 is also a conducting film. That is, as in the method the present invention for manufacturing of the contact portion, in case the conducting film under the organic insulating film is etched, when the conducting film is etched to the lower part of the organic insulating film to form an under-cut on the contact portion, by forming the periphery of the contact hole thinner and removing this by the ashing process to expose the conducting film on the contact portion, the under-cut thereon can be removed.

Figure 2A:
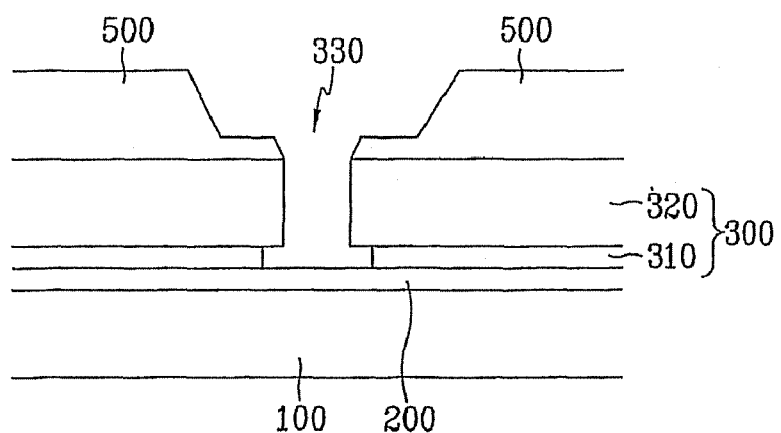
FIG. 2a to FIG. 2d are cross-sectional views showing a method for manufacturing a contact portion of a semiconductor device by a process order according to a second embodiment of the present invention.
Figure 2B:
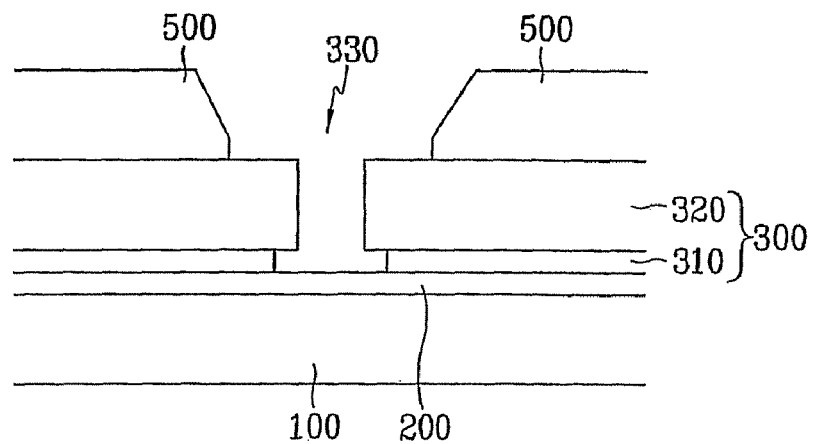
Figure 2C:
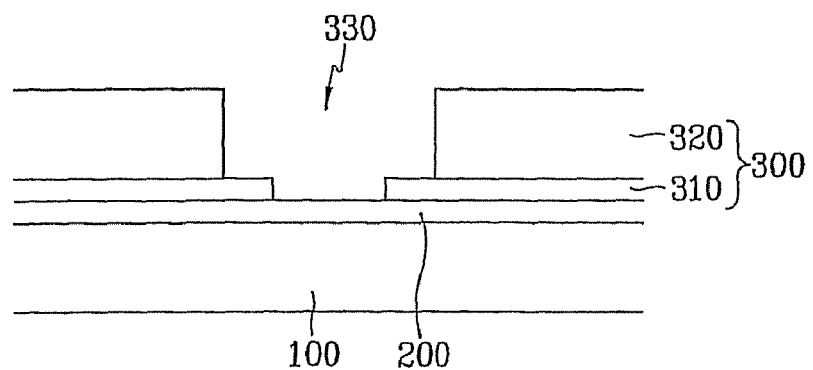

In the meanwhile, in a contact hole of a semiconductor device and a manufacturing thereof according to a second embodiment of the present invention, as shown in FIG. 2a, when an interlayer insulating film 300 is made of a dual layer including a lower insulating film 310 and an upper lower insulating film 320, and the insulating film 300 is patterned using the organic insulating film 320 (See FIG. 1b) as a photosensitive pattern of an etching mask to form the contact hole for exposing a first wiring 200, the lower insulating film 310 is etched to the lower part of the upper insulating film to be able to generate an under-cut. Also, in this case, as shown in FIG. 2a, part of the photosensitive film pattern 500 around the contact hole 330 is formed thinner than that in the other portions.

Next, part of the photosensitive film pattern 500 around the contact hole 330 formed thinner than that in the other portions is removed by performing an ashing process. Here, it is preferable that an etching condition has an etching selectivity of the upper insulating film 320 and the lower insulating film 310.

Figure 2D:
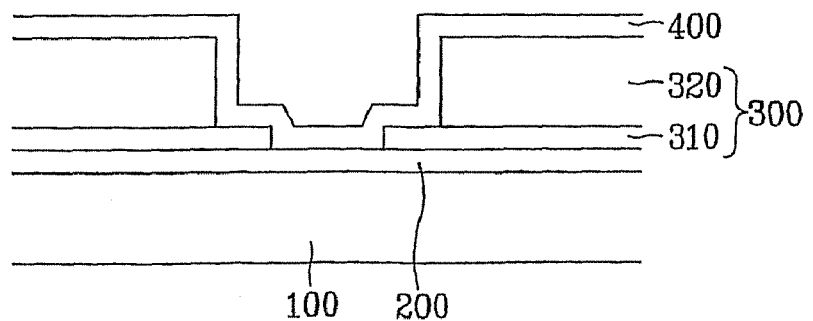

Next, as shown in FIG. 2d, by removing the photosensitive film pattern 500, depositing a conducting material on the upper insulating film 320, and patterning it by a photolithography process using a mask, a second wiring 400 electrically connected to the first wiring 200 is formed.

In the contact portion of the semiconductor device and the manufacturing thereof according to the second embodiment of the present invention, when the interlayer insulating film is made of an organic material and the contact hole exposing the first wiring 200 is formed, by forming the photosensitive film defining the contact hole step-shaped and performing the ashing process after etching the lower insulating film 330 to remove a part of the photosensitive film, and the upper insulating film is etched again using the photosensitive mask as a mask, thereby removing the under-cut structure generated in the contact portion. This can prevent the second wiring 400 from disconnecting with the first wiring 200, and improve the profile of the second wiring 400 in the contact portion smooth.

In the meanwhile, the contact portion of the semiconductor device and the manufacturing method thereof can be also applicable to a thin film transistor array substrate for liquid crystal display and a manufacturing method thereof. Here, it will be described that the contact portion of the semiconductor and the manufacturing method thereof according to the first embodiment of the present invention is applied to a thin film transistor for liquid crystal display and a manufacturing method thereof according to the first embodiment of the present invention, and that the contact portion of the semiconductor and the manufacturing method thereof according to the second embodiment of the present invention is applied to a thin film transistor for liquid crystal display and a manufacturing method thereof according to the second embodiment of the present invention.

First, a structure of a thin film transistor panel for liquid crystal display according to a first embodiment of the present invention will be described in detail with reference to FIG. 3 and FIG. 4.

Figure 3:
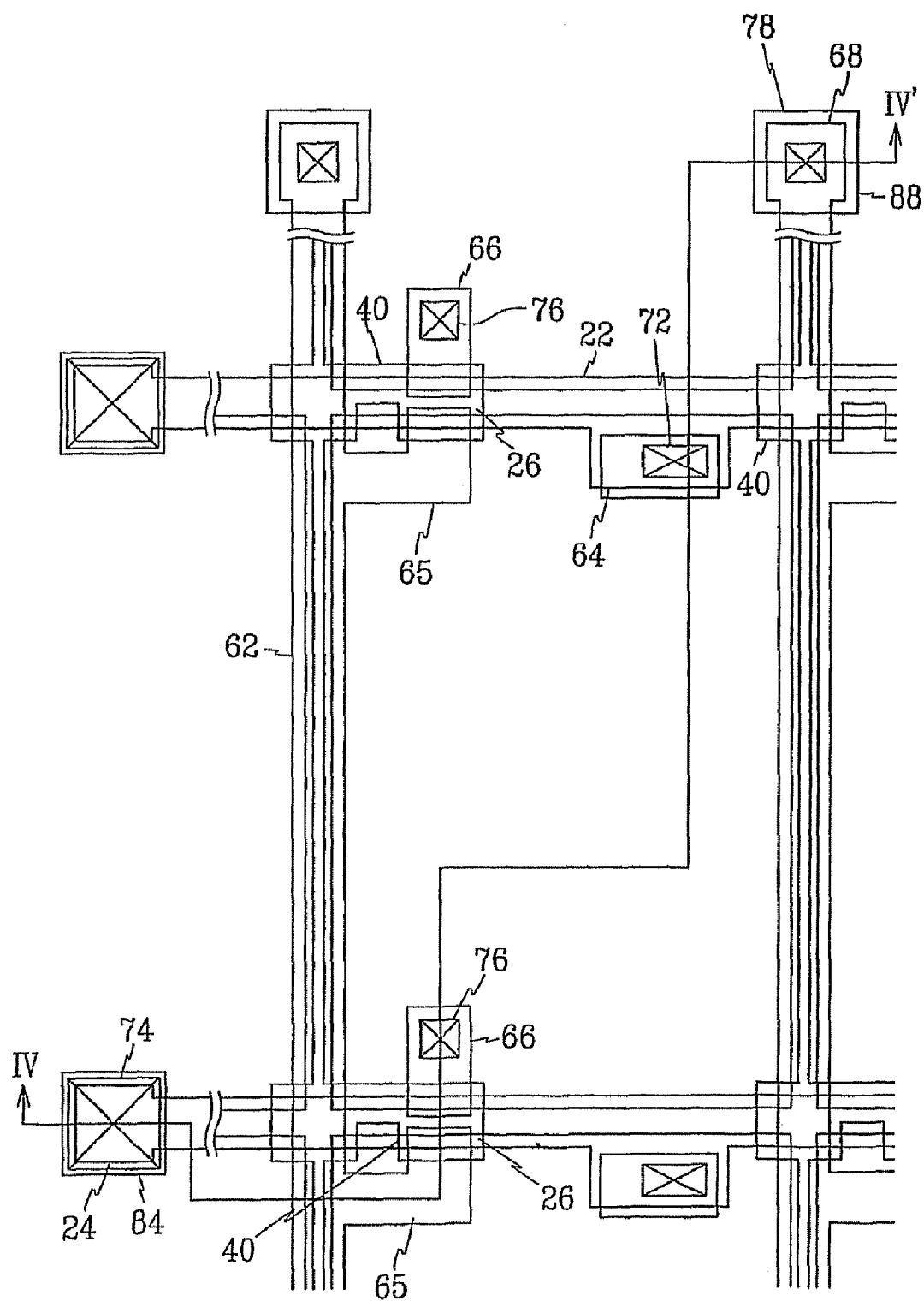
FIG. 3 is a thin film transistor array panel for liquid crystal display according to the first embodiment.
Figure 4:
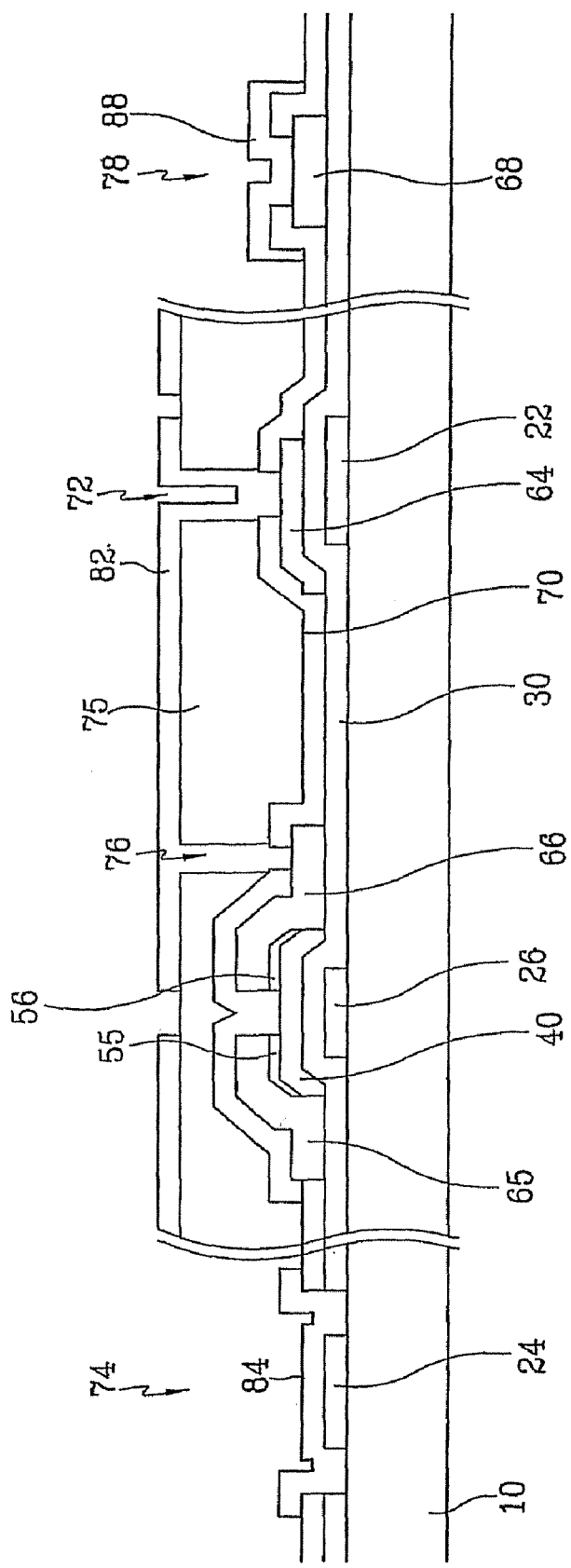
FIG. 4 is a cross-sectional view taken along IV-IV' of the thin film transistor panel shown in FIG. 3.

FIG. 3 shows a thin film transistor panel for liquid crystal display according to a first embodiment of the present invention, and FIG. 4 is a cross-sectional view taken along the IV-IV' of the thin film transistor shown in FIG. 3.

Gate wire including aluminum-based metal material having a low resistance are disposed on an insulating substrate 10. The gate wire include gate lines 22 extending in a horizontal direction, gate pads 24 connected to one end of the gate lines 22 to transmit gate signals from an external device to the gate lines, and gate electrodes 26 of the thin film transistor connected to the gate lines 22.

The gate wire 22, 24 and 26 are preferably formed of aluminum-based single layer, however, they may be formed of more than two layers. In case of forming more than two layers, it is preferable that one layer is formed of a material with a low resistance and the other layers are formed of chromium-based or molybdenum-based materials that are excellent in a contact characteristic with other materials such as ITO, IZO or the substrate.

A gate insulating film 30 made of SiNx, etc., covers the gate wire 22, 24 and 26 on the substrate 10, and has a contact hole 74 for exposing the gate pad 24 with a passivation layer 70 formed later.

A semiconductor layer made of semiconductor such as amorphous silicon, etc., is formed on the gate insulating layer of the gate electrode 24, and, ohmic contact layers 55 and 56 made of material such as n+ hydrogenated amorphous silicon doped with high-concentrated silicide or n-type impurity, are formed on the semiconductor layer 40, each of which is formed divided into two parts as seen in the center of gate pad 26.

Data wire 62, 64, 65 and 66 made of metals, for example, Al or Al alloy, Mo or MoW alloy, Cr, Ta, etc., or of conductor, are formed on the ohmic contact layers 55 and 56 and the gate insulating film 30. The data wire include data lines disposed in a vertical direction, crossing with the gate lines 22 to define the pixels, source electrodes 62 which are branches of the data lines and extend to upper side of the ohmic contact layer 55, data pads 68 connected to one end of the data lines 62 and receiving image signals from an external device, and drain electrodes 66 separated from the source electrodes and formed on the ohmic contact layer 56 disposed opposite to source electrodes 65 in relation to the gate electrodes 26. In the meanwhile, the data wire may include a conductor pattern for storage capacitor which overlaps the gate lines 22 and has a purpose of securing a storage capacity.

The data wire 62, 64, 65, 66 and 68 may be formed of single layer made of Al or Al alloy too, and formed of more than dual layers. In case of being formed of dual layers, it is preferable that one layer is formed of material with a low resistance and the other layers are formed of material whose the contact characteristic is excellent. As such an example, there are Cr/Al (or Al alloy) or Al/Mo, and in this regards, Cr film has a function to prevent Al film or Al alloy film from being dispersed into Si layers 40, 55 and 56, which also has a function as a contact portion for securing contact characteristics between the data wire 62, 64, 65, 66 and 68 and pixel electrodes formed later.

On the data wire 62, 64, 65, 66 and 68 and the semiconductor layer 40 not blocked by those, the passivation layer 70 made of SiNx, and an organic insulating film made of acril-based photosensitive organic material having a smoothing characteristic and a low dielectric constant, are formed. On the passivation layer 70, the conductor pattern for storage capacitor 64, the drain electrodes 66 and the contact holes 72, 76 and 78 for exposing the data pads 68 are formed respectively, and also, the contact hole 74 for exposing the gate pads 24 with the gate insulating film 30 is formed. Here, the borderline of the organic insulating film in the contact holes 72 and 76 is formed on the passivation film 70 to expose the borderline of the passivation film 70 or the gate insulating film 30, and hence the sidewalls defining the contact holes 72 and 76 become step-shaped. In addition, it is preferable that the organic insulating film 75 is removed from the pad portion where the gate pads and the data pads are formed, and the contact hole 74 for exposing the gate pad 24 is formed larger than the gate pad 24.

On the organic insulating film 75, pixel wire, which include pixel electrodes 82 connected to the drain electrodes 66 via the contact hole 76 and located in the pixels, and assistant gate pads 84 and assistant data pads 88 each connected to the gate pads 24 and the data pads 68 via the contact holes 74 and 78, and are made of ITO (indium tin oxide) or IZO (indium zinc oxide) which is a transparent conducting material, are formed. In this regard, as described above, in the contact portion, the sidewall of the passivation film 70 or the organic insulating film 75, a lower insulating film has a step-shaped and has no under-cut structure, and therefore this can prevent the pixel electrodes, the assistant gate pads 84 and the assistant data pads 88 from being disconnected. Here, since the organic insulating film 75 is removed from the pad portion, the assistant gate pads 84 and the assistant data pads 88 are formed only to the upper side of the passivation film 70. The reason is that the organic insulating film 75 is very poor of adhesive strength, chemical-resisting quality, hardness, mechanical intensity, stress, etc., compared with a passivation film made of SiNx. Therefore, in case that the organic insulating film 75 exists in the pad portion, when a driving integrated circuit is directly mounted on a thin film transistor for liquid crystal display using COG (chip on glass) manner or a film where a driving integrated circuit is packed by TCP or COF manner is attached thereto, an adhesive strength of the pad portion is poor and, in turn, this cause a poor adhesion. In addition, when rework is required to improve the poor adhesion, an anisotropy conducting film should be removed from the pad portion after the driving integrated circuit or the film is detached therefrom, and here, if the organic insulating film remains behind, this causes a problem of a surface damage of the pad portion or an ITO film peeling-off between the organic insulating film and the assistant films 84 and 88. Thus, completely removing the organic insulating film from the pad portion can improve the adhesive strength between the pad and the driving integrated circuit or the film, and can practice the rework very easily.

As shown in FIGS. 3 and 4, the pixel electrodes overlaps the gate lines 22 to form storage capacitors, and here, when the storage capacities are deficient, independent wires for storage capacities separated from the gate wire 22, 24 and 26 may be added to the same layer as the gate wire 22, 24 and 26.

Then, the method for manufacturing a thin film transistor for liquid crystal display according to the first embodiment of the present invention will be described in detail with reference to FIGS. 3 and 4, and FIG. 5a to FIG. 10.

Figure 5A:
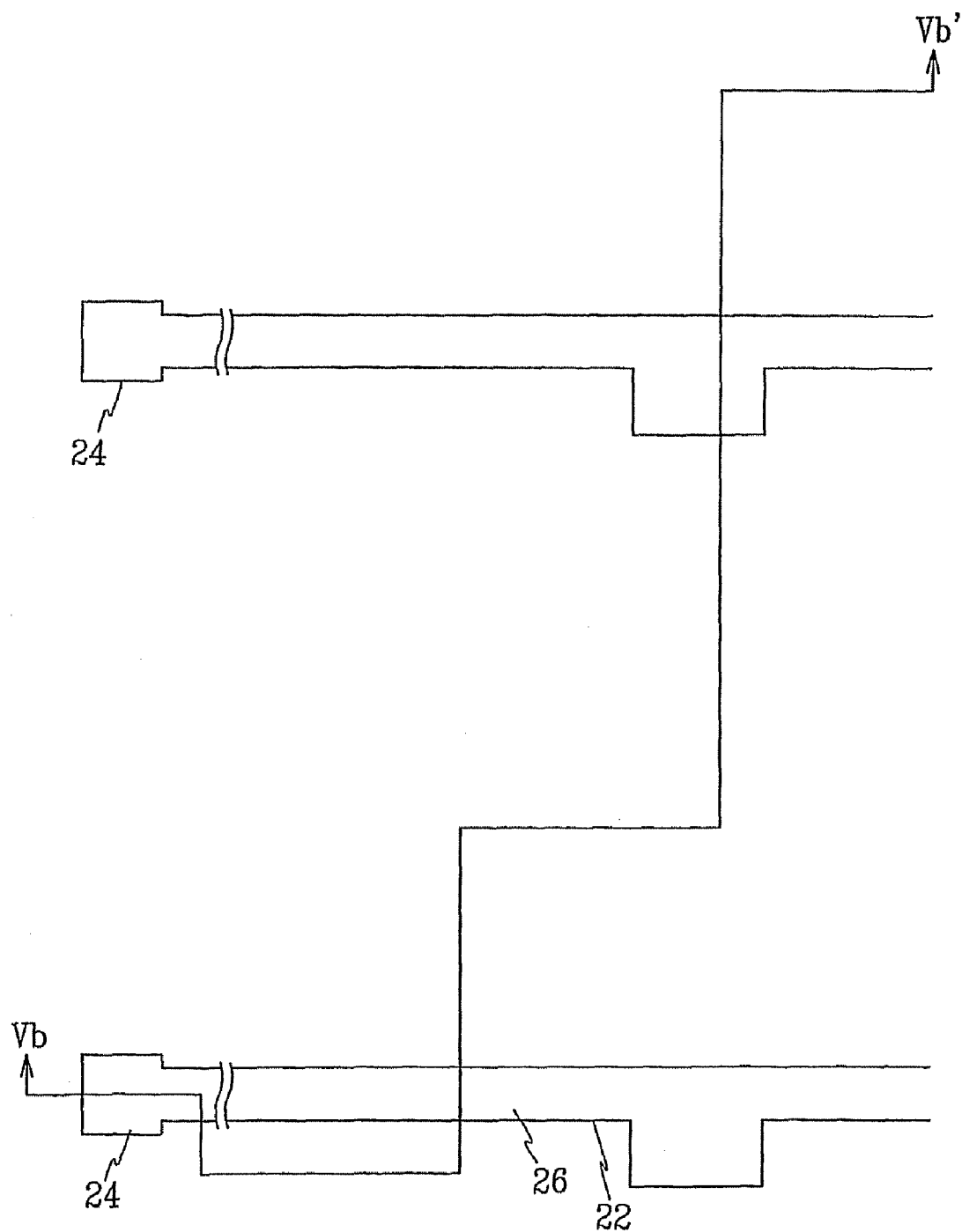
FIGS. 5a, 6a, 7a and 8a are arrangement diagrams of the thin film transistor panel in the mid-process of manufacturing the thin film transistor panel for liquid crystal display according to the first embodiment of the present invention.
Figure 5B:
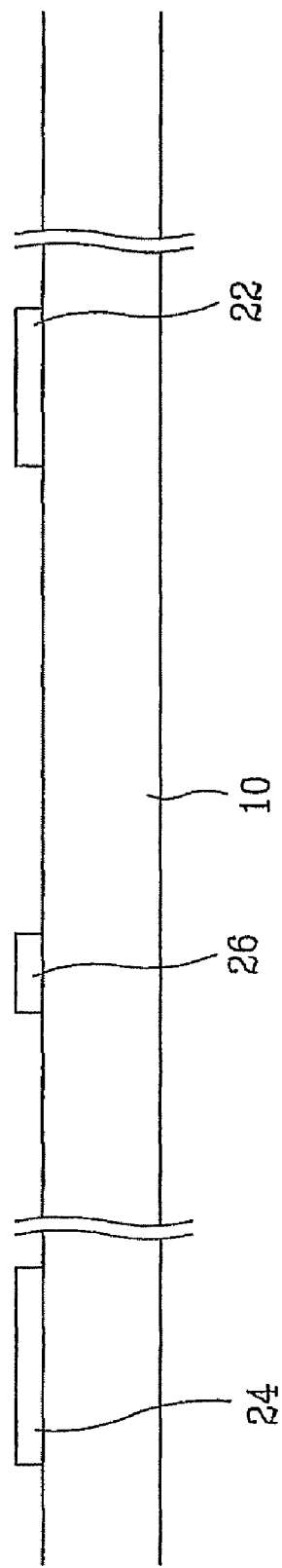

First, as shown in FIGS. 5a and 5b, on a substrate 10, a conducting material whose contact characteristic is excellent or which has resistance such as Al or Al alloy, and Ag or Ag alloy, is deposited and patterned to form gate wire including gate lines 22, gate electrodes 26 and gate pads 24.

Figure 6A:
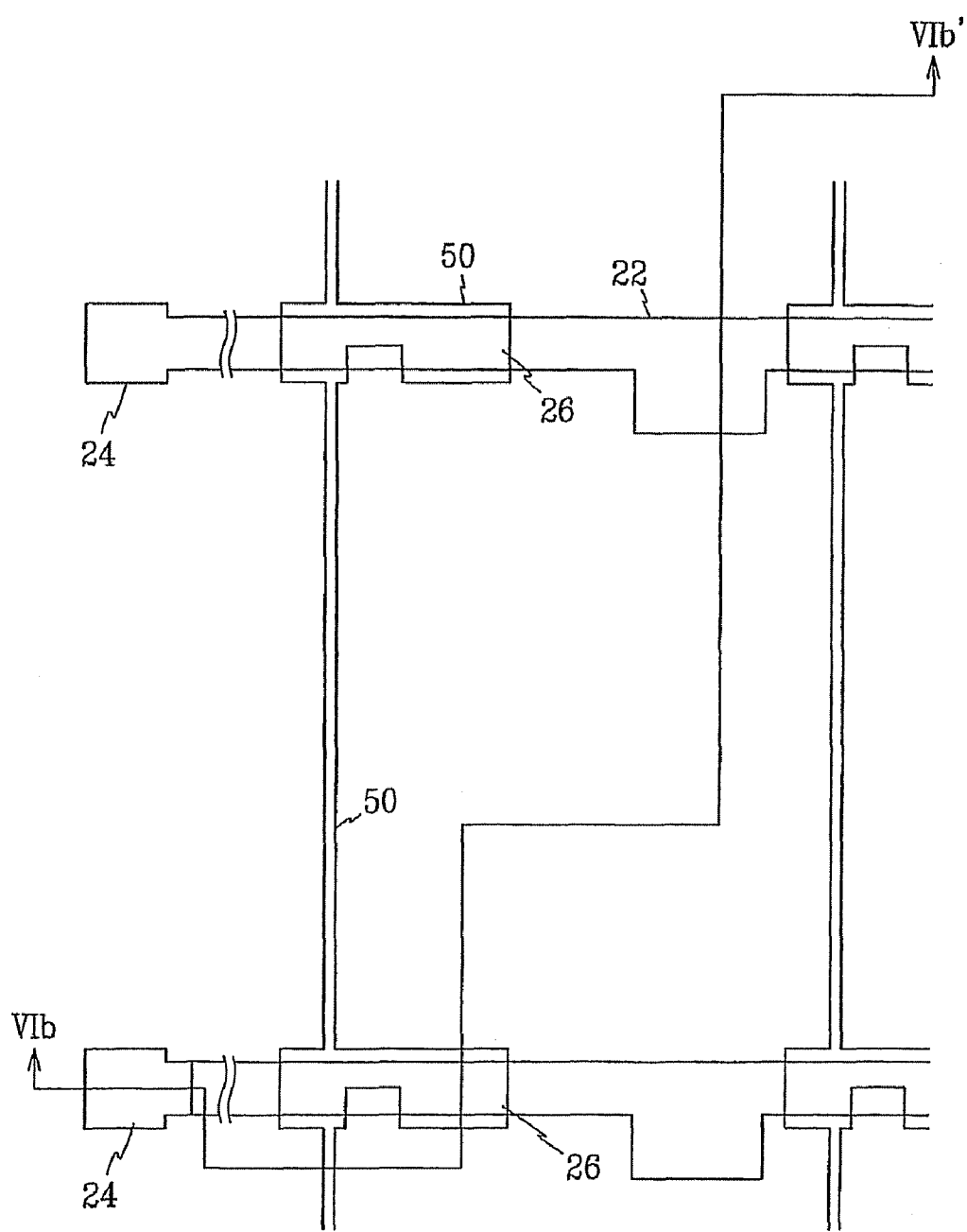
Figure 6B:
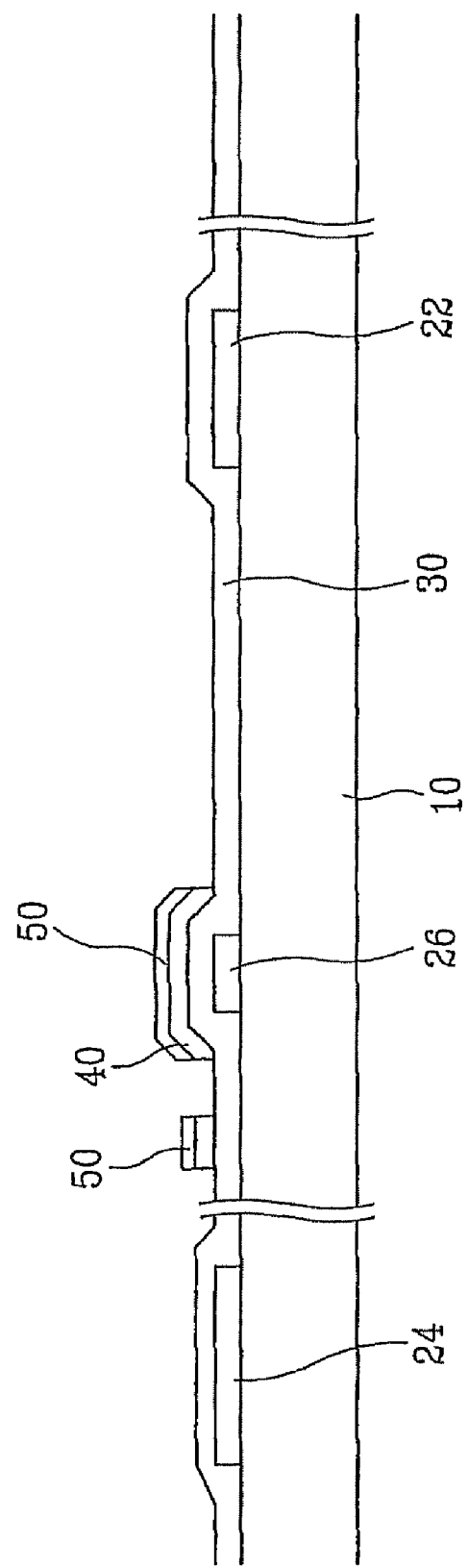
FIG. 6b is a cross-sectional view taken along VIb-VIb' shown in FIG. 6a, and shows next step of FIG. 5b.

Next, as shown in FIGS. 6a and 6b, three-layer film, a gate insulating film 30, a semiconductor layer 40 made of an amorphous silicon and a doped amorphous silicon layer 50, is deposited successively, and the semiconductor layer 40 and the doped amorphous silicon layer 50 are patterned by a patterning process using a mask, thereby forming the semiconductor layer 40 and the ohmic contact layer 50 on the gate insulating film 30 disposed opposite to the gate electrode 24. In this regard, as shown in FIGS. 6a and 6b, the semiconductor layer 40 and the ohmic contact layer 50 are formed along the data lines formed later.

Figure 7A:
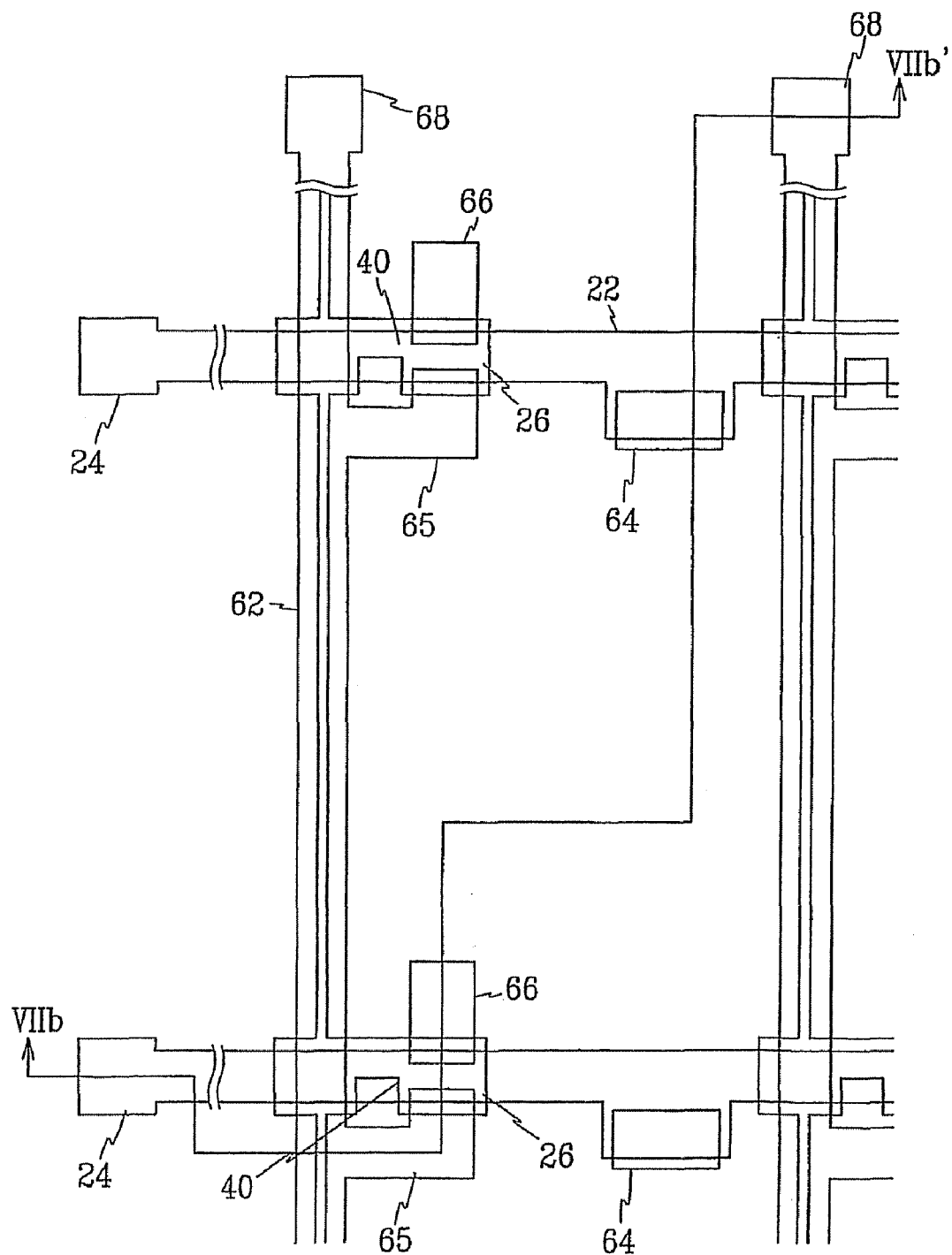
Figure 7B:
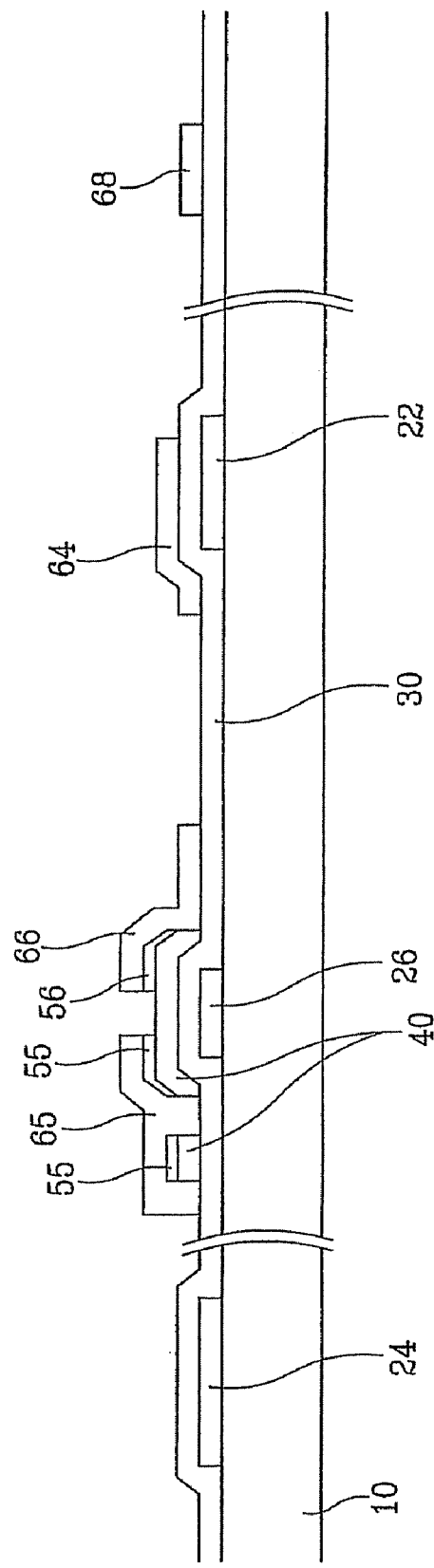
FIG. 7b is a cross-sectional view taken along VIIb-VIIb' shown in FIG. 7a, and shows next step of FIG. 6b.

Next, as shown in FIGS. 7a and 7b, a conducting material such as Cr, Mo or Mo alloy, Al or Al alloy, or Ag or Ag alloy is deposited, and then, patterned by a photo etching using a mask to form data wire including data lines 62 crossing with the gate lines, source electrodes 65 connected to the data lines 62 to extend to upper side of the gate electrodes 26, data pads 68 connected to one end of the data lines 62, drain electrodes 66 separated from the source electrodes 65 and disposed opposite thereto, and conductor patterns for storage capacitors.

Next, the amorphous silicon layer pattern 50 not blocked by the data wire 62, 64, 65, 66 and 68 is etched to be divided into two parts centering around the gate electrode 26, and simultaneously the semiconductor layer 40 interposed between the doped amorphous silicon layers 55 and 56 is exposed. Then, it is preferable to practice an oxygen plasma in order to stabilize a surface of the exposed semiconductor 40.

Figure 8A:
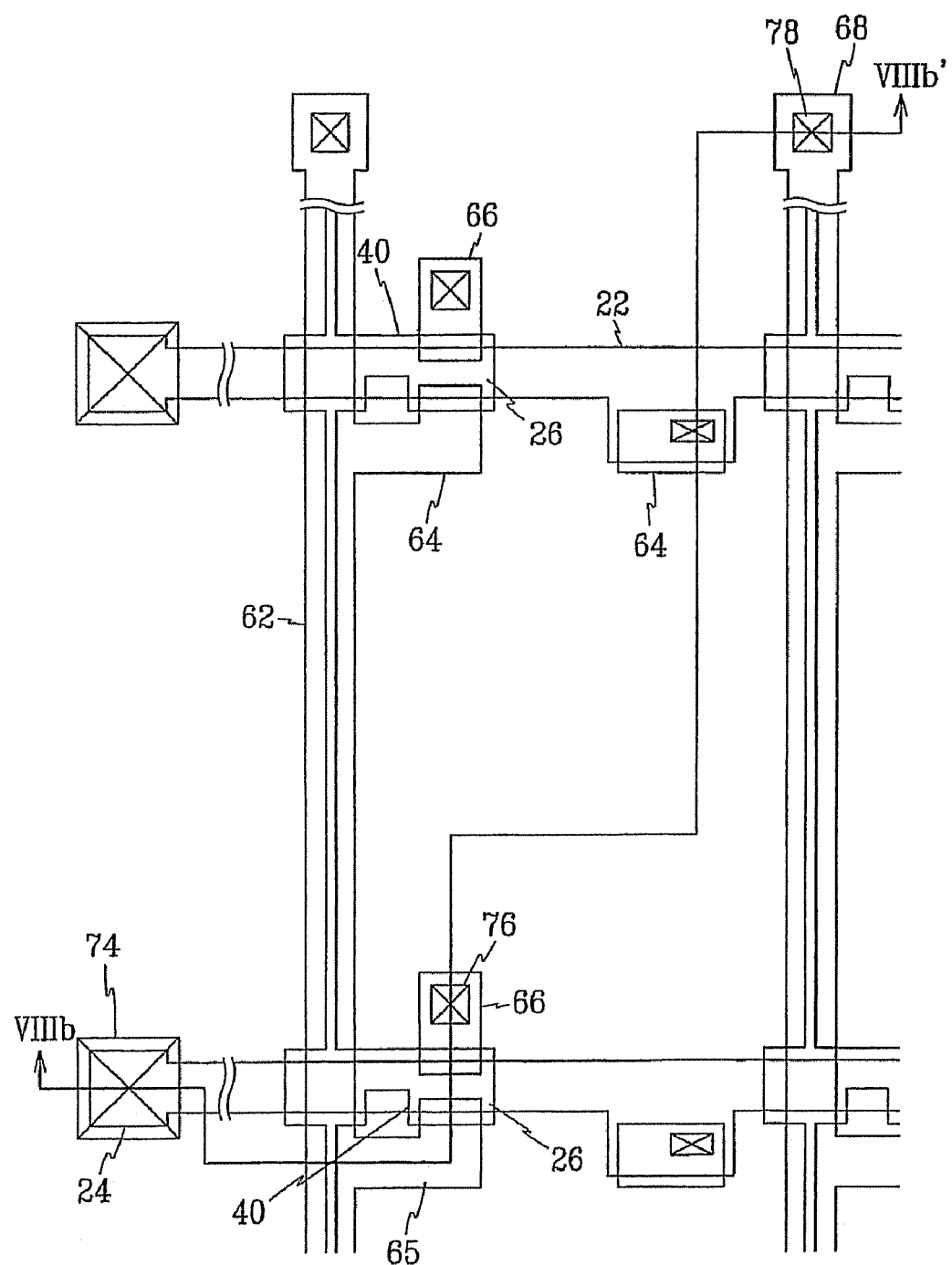
Figure 8B:
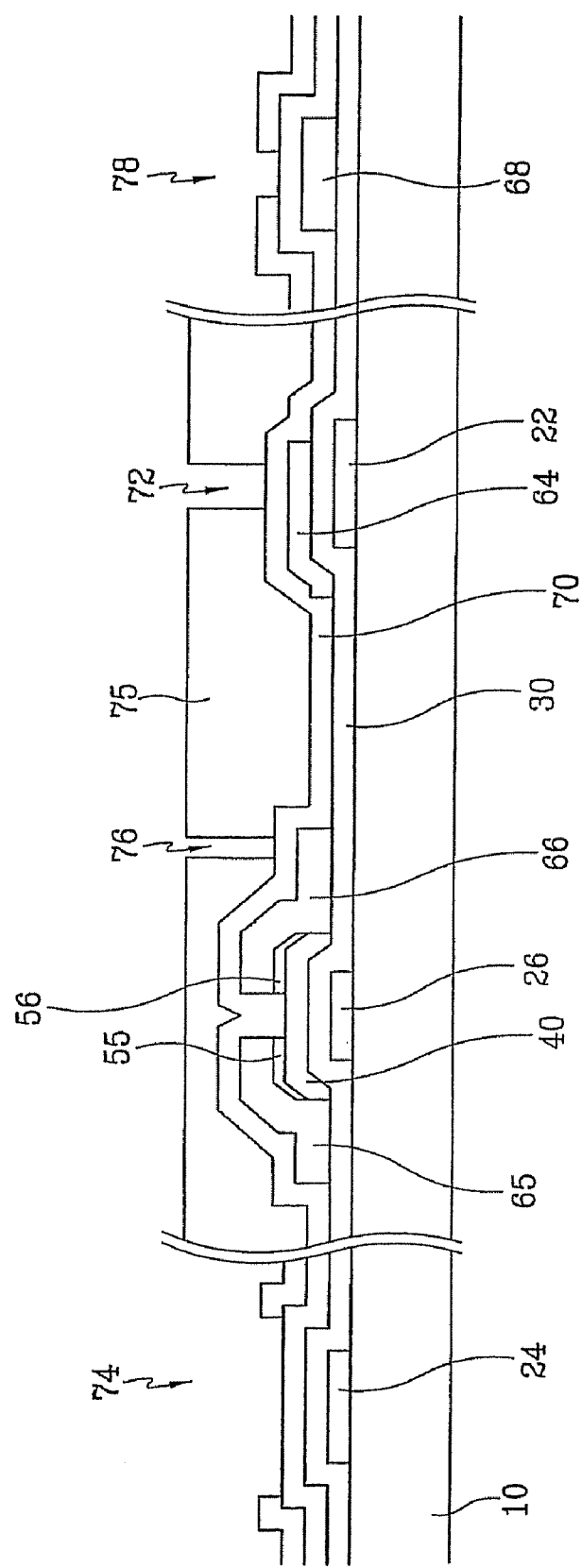
FIG. 8b is a cross-sectional view taken along shown in FIG. 8a, and shows next step of FIG. 7b.

Next, as shown in FIGS. 8a and 8b, the passivation layer 70 made of SiNx is deposited no more than 2,000 Å thick, preferably, 1,000 Å thick, and the organic insulating film 75 made of a organic insulating material with a photosensitivity is formed in a range of 2~4 μm thick thereon, and, first, only the organic insulating film 75 is exposed and developed by a photo process using a mask to form contact holes 72, 74, 76 and 78 on the conductor pattern for the storage capacitor 64, the gate pad 24, the drain electrode 66 and the data pad 68, respectively. A pattern of slit type or a lattice type, or a semi-transmittance area made of a semi-transparent film is formed so that a light transmittance around transmittance area of the mask is reduced, and the organic insulating film 75 around the pad portion where several pads 24 and 68 are formed or the contact holes 74 and 78 is formed thinner than that in the other portions, preferably, insulating film a range of 1,000~5,000 Å thick. Of course, in this regard, the organic insulating film 75 around the contact holes 72 and 76 for exposing the drain electrode 66 and the conductor pattern for the storage capacitor 64 may be formed with a step-shaped structure that its thickness is thinner than the other portions.

In the meanwhile, a seal line is formed on one panel of them for the purpose of attaching two panels for liquid crystal display and sealing the liquid crystal material interposed therebetween, and since the adhesive strength of the seal line becomes weak on forming the seal line on an organic insulating film 75, a poor contact is generated between the two panels. It is preferable that, in order to prevent the poor contact, the organic insulating film 75 is removed from an area where the seal line will be formed later, and that, for this, as shown in FIG. 8c, by forming a semi-transmittance area on the mask of the area where the seal line will be formed, the organic insulating film 75 is formed thinner than the other portions.

FIG. 22 is a cross-sectional view with a seal line according to FIG. 8C. The FIG. 22 shows seal lines located in the removed organic insulating film 75.

Here, a method for adjusting the thickness of a photosensitive film will be described in detail later when a method for manufacturing a thin film transistor array panel for liquid crystal display using four masks is describe.

Figure 9:
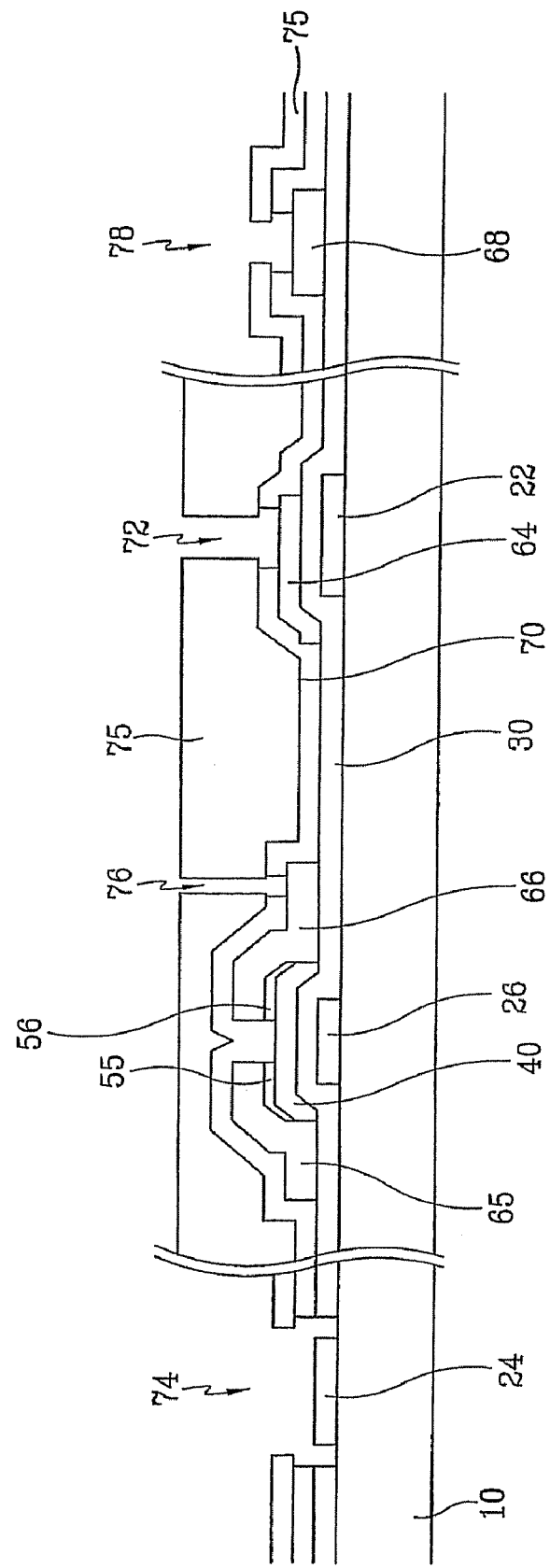
FIG. 9 is a cross-sectional view taken along shown in FIG. 8b, and shows next step of FIG. 8b.

Next, as shown in FIG. 9, the passivation film 70 and the gate insulating film 30 exposed by the contact holes 72, 74, 76 and 78 using the organic insulating film 75 as an etching mask are etched and so the conductor pattern for storage capacitor 64, the gate pattern 24, the drain electrode 66 and the data pad 68 are exposed. Here, a method to etch the passivation film 70 is preferably a dry etching, and $SF6^+O_2$ or $CR4^+O_2$ is used as a dry etching gas. When the passivation film and the gate insulating film 30 are etched, as seen in drawings, they are etched to lower side of the organic insulating film 75 to cause an under-cut, though using a dry etching.

Figure 10A:
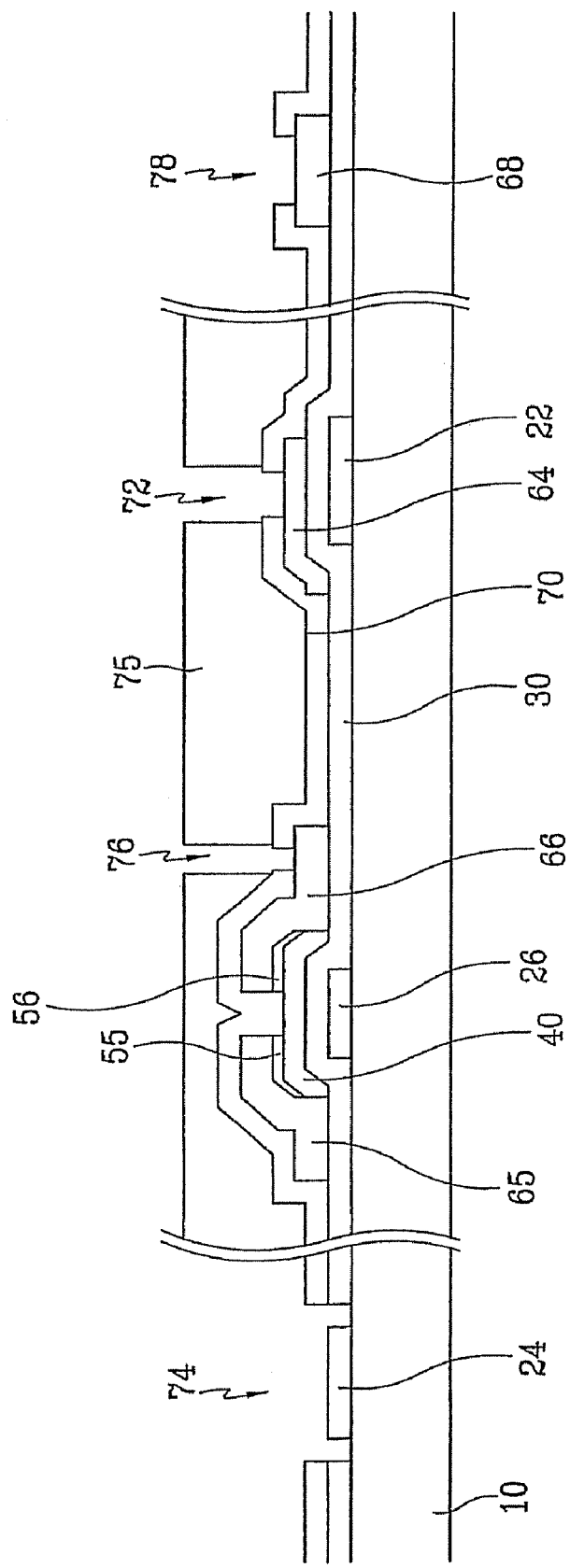
FIG. 10a is a cross-sectional view taken along shown in FIG. 8a, and shows next step of FIG. 9b.
Figure 10B:
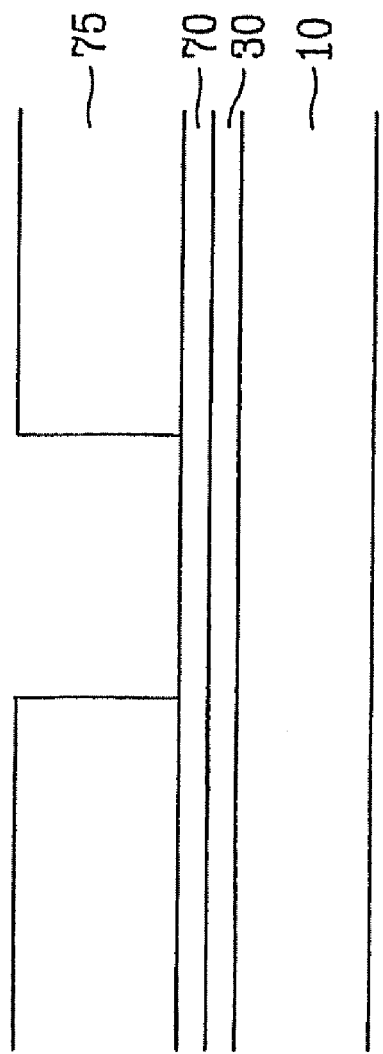
FIG. 10b is a cross-sectional view showing next step of FIG. 8c.

Next, as shown in FIG. 10a, an ashing process is performed to remove part of the organic insulating film 75, so that, in the pad portion, the passivation layer 70 around the contact holes 74 and 78 is exposed by removing the organic insulating film 75 having a small thickness, and in the contact holes 72 and 76, the gate insulating film 30 and the passivation film 70 are exposed by the organic insulating film 75. This enables the under-cut structure generated in the contact portion to be removed. Here, as shown in FIG. 10b, the passivation film 70 made of SiNx is exposed in an area for forming the seal line. In this way, the seal line formed later can be formed on the passivation layer to improve the adhesive strength between the two panels for liquid crystal display.

FIG. 23 is a cross-sectional view with a seal line according to FIG. 10b. The FIG. 23 shows seal lines located in the removed organic insulating film 75.

Finally, as previously shown in FIGS. 3 and 4, by depositing an ITO or an IZO and performing a patterning using a mask, the conductor pattern for storage capacitor 64 and the pixel electrode 82 connected to the drain electrode 66 through the contact holes 72 and 76 are each formed, and also the assistant gate pad 84 and the assistant data pad 88 each connected to the gate pad 24 and the data pad 68 through the contact holes 74 and 78 are each formed. As described above, the under-cut structure generated in the contact portion is removed by forming the organic insulating film 75 around the contact holes 72, 74, 76 and 78 thinner and performing an ashing process, so that the pixel electrode 82, the assistant gate pad 84 and the assistant data pad 88 can be prevented from being disconnected and the profile of them can be formed smooth. Here, as seen in drawings, the assistant gate pad 84 and the assistant data pad 88 are formed to upper side of the passivation film 70. When the assistant gate pad 84 or the assistant data pad 88 needs to cover lower metal pads 24 and 68 completely for the purpose of preventing the pads 24 and 68 from being corroded and is formed to the upper side of the passivation film 70, there are advantages of an improvement of the adhesive strength between the assistant pads 84 and 88 and an enlargement of the assistant pads 84 and 88.

In the method for manufacturing the thin film transistor for liquid crystal display according to the first embodiment, as described above, although the manufacturing method thereof described using five masks, it is equally applicable to a manufacturing method thereof using four masks. This will be described in detail with reference to drawings. It will be described that a method for manufacturing a semiconductor device according to a second embodiment, which uses an organic insulating film not as an interlayer insulating film but as a photosensitive film pattern and adds a low dielectric CVD insulating film which has a low dielectric constant less than 4.0 and is formed by a chemical vapor deposition, is applied.

First, referring to FIG. 11 to FIG. 13, a unit pixel structure of a thin film transistor array panel for liquid crystal display formed by using four masks according to an embodiment of the present invention will be described in detail.

Figure 11:
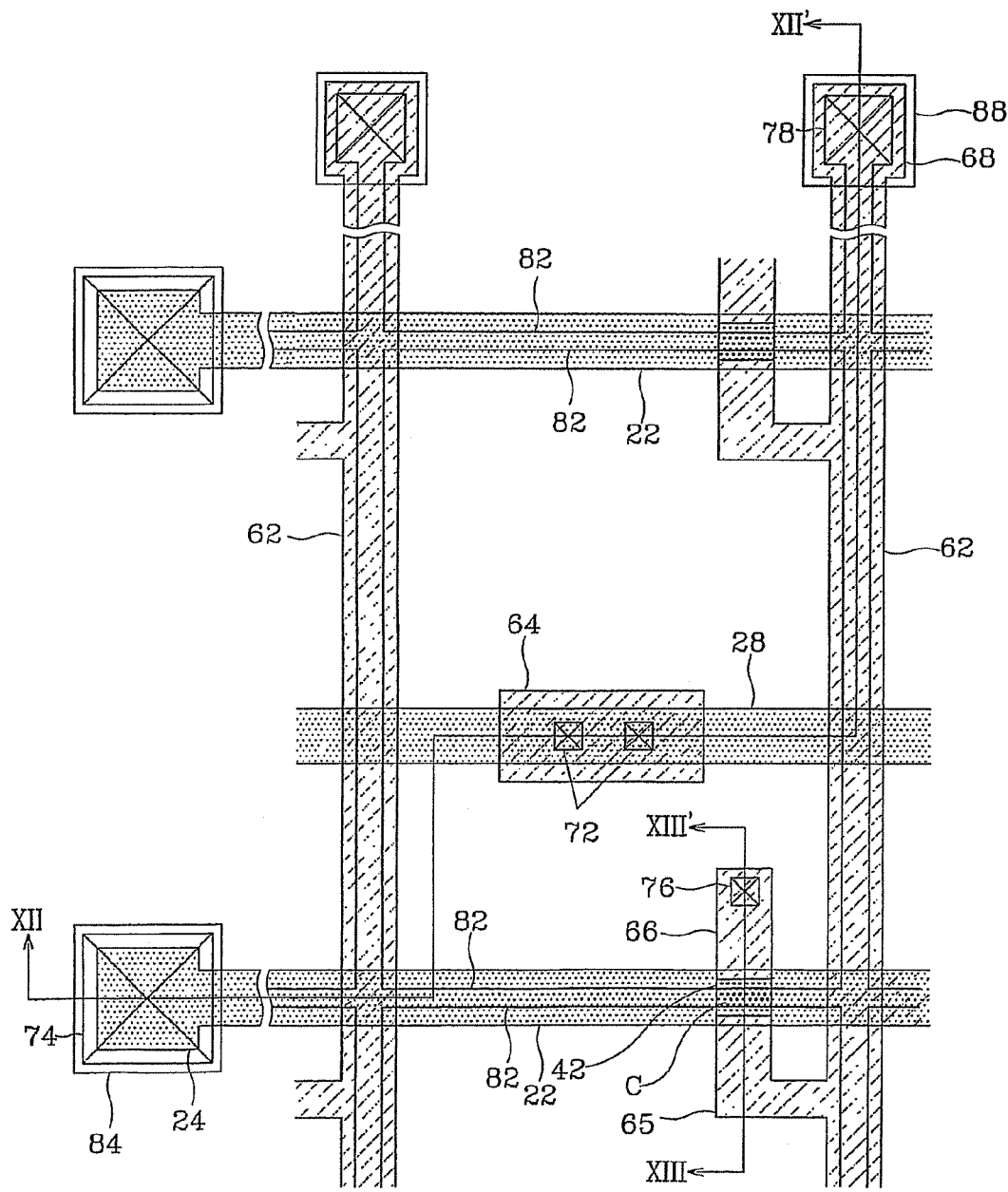
FIG. 11 is an arrangement view of a thin film transistor panel for liquid crystal display according to a second embodiment.
Figure 12:
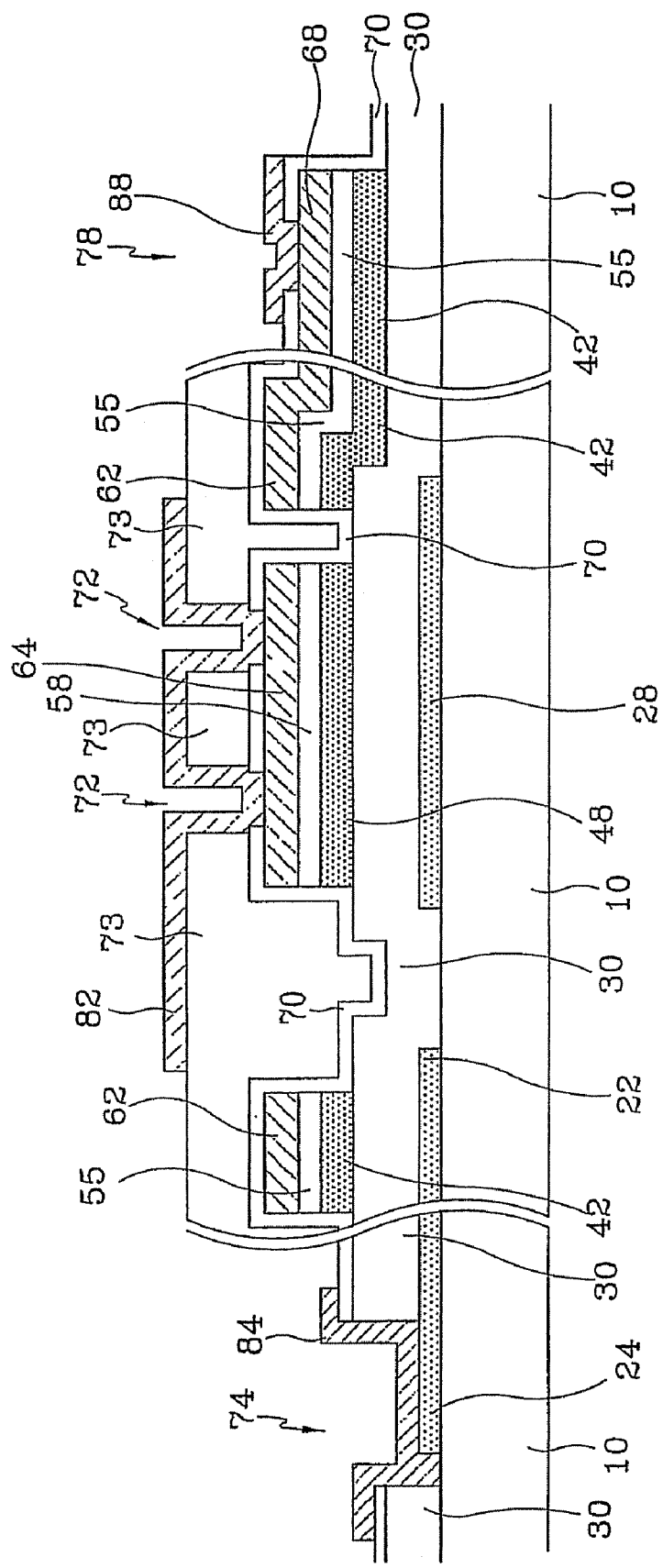
FIG. 12 and FIG. 13 are cross-sectional views taken along X II-X II' and X III-X III' of the thin film transistor shown in FIG. 11.
Figure 13:
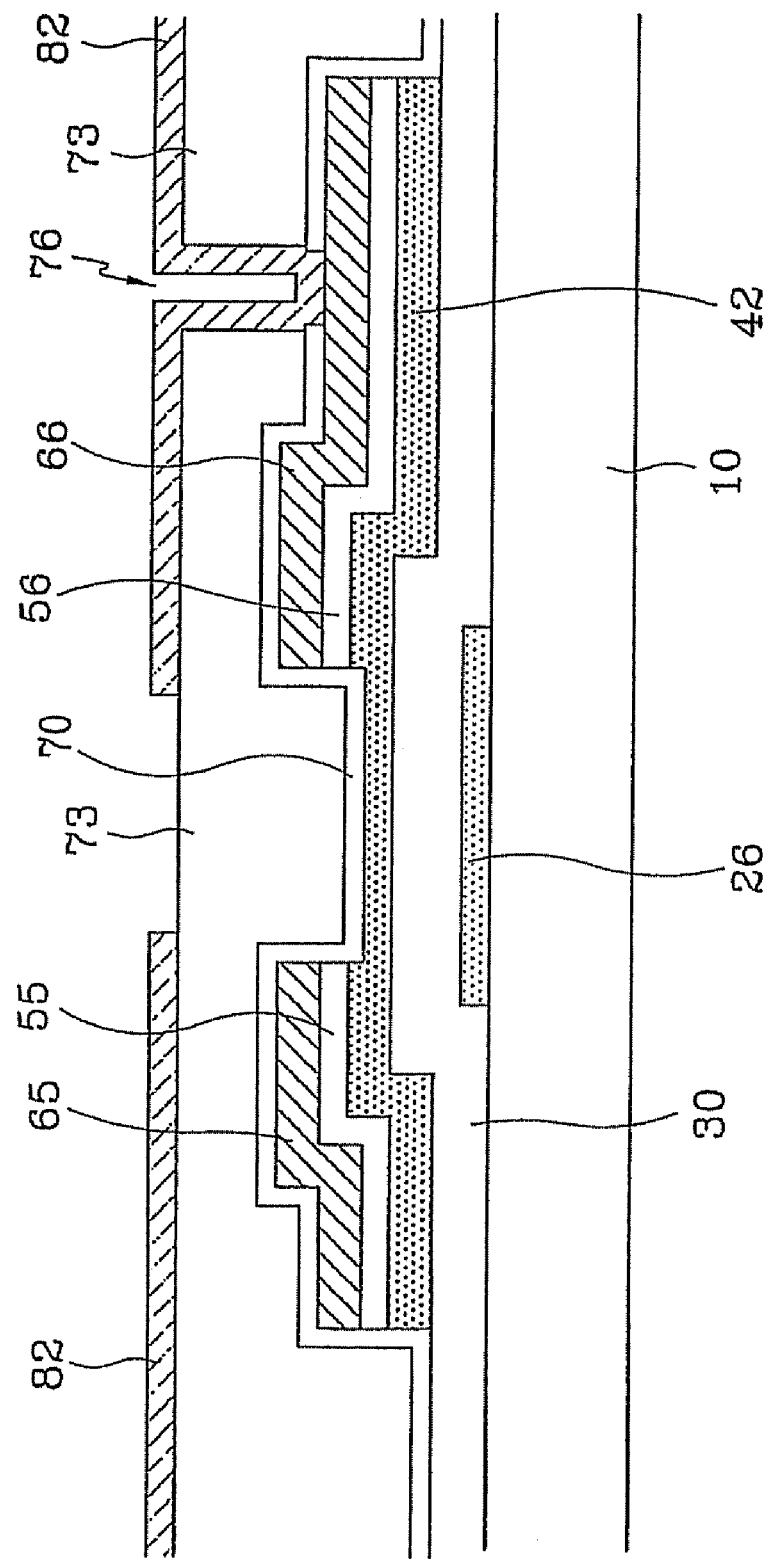

FIG. 11 is an arrangement view of a thin film transistor panel for liquid crystal display according to a second embodiment, and FIG. 12 and FIG. 13 are cross-sectional views taken along X II-X II' and X III-X III' of the thin film transistor shown in FIG. 11.

Like the first embodiment, gate wire, which include gate lines 22 made of conducting material with a low resistance such as, Al or Al alloy, or Ag or Ag alloy, etc., gate pad 24 and gate electrode 26, are formed on an insulating substrate 10. The gate wire also include a storage electrode 28 which is parallel with the gate lines 22 on the substrate 10 and is applied with a voltage such as a common electrode voltage inputted to a common electrode placed in an upper plate from an external device. The storage electrode 28 overlaps a conductor pattern for storage capacitor 68 connected to a pixel electrode described later to form a storage capacitor for improving charge reservation ability of the pixel, and if a storage capacity generated by overlapping the pixel electrode 82 described later with the gate line 22 is enough, the storage capacitor may not be formed.

A gate insulating film 30 made of SiNx, etc., is formed on the gate wire 22, 24, 26 and 28 to cover these.

Semiconductor patterns 42 and 48 made of a semiconductor such as a hydrogenated amorphous silicon is formed on the gate insulating film 30, and ohmic contact layer pattern or middle layer patterns 55, 56 and 58 made of an amorphous silicon which n-type impurity such as P is doped with high concentration are formed on the semiconductor patterns 42 and 48.

Data wire made of an aluminum-based conducting material with low resistance are formed on the ohmic contact layer patterns 55, 56 and 58. The data wire include data line portion comprising data line 62, a data pad 68 connected to one end of the data line 62 to be applied with image signals from an external device, and a source electrode 65 of thin film transistor which is branch of the data line 62. The data wire also include a drain electrode 66 of thin film transistor separate from the data line portion 62, 68 and 65 and placed opposite to the source electrode 65 in relation to the gate electrode or channel C, and a conductor pattern for storage capacitor 64 placed over the storage electrode 28. In case the storage electrode is not formed, neither is the conductor pattern formed.

The contact layer patterns 55, 56 and 58 play a part in reducing the contact resistance between the semiconductor patterns 42 and 48 and the data wire 62, 64, 65, 66 and 68 under themselves, and have perfectly the same shapes as the data wire 62, 64, 65, 66 and 68. That is, the middle layer pattern 55 in the data portion has the same shape as the data portion 62, 65 and 68, the middle layer pattern for the drain electrode 56 has the same shape as the drain electrode 66, and the middle layer pattern for the storage capacitor 58 has the same shape as the conductor pattern for the storage capacitor 68.

In the meantime, the semiconductor patterns 42 and 48 have the same shapes as the data wire 62, 64, 65, 66 and 68 and the ohmic contact layer patterns 55, 56 and 58 except the channel portion of the thin film transistor. In detail, the semiconductor pattern for storage capacitor 48, the conductor pattern for storage capacitor 68 and the contact layer pattern for storage capacitor 58 have the same shapes, but the semiconductor pattern for thin film transistor 42 has the slightly different shape from the data wire and the contact layer patterns. In other words, the data line portion 62, 68 and 65 in the channel portion of the thin film transistor, in particular, the source electrode 65 and the drain electrode 66 are separate, and the middle layer 55 of the data line portion and the contact layer pattern for drain electrode 56 are also separate, however, the semiconductor pattern for thin film transistor 42 is not disconnected but connected in this place to form a channel of thin film transistor.

Unlike the first embodiment, on the data wire 62, 64, 65, 66 and 68, the passivation film made of SiNx, and the low dielectric insulating film 73 that has a low dielectric constant less than 4.0 and is formed by a chemical vapor deposition, are formed, and these have the contact holes 76, 78 and 72 for exposing the drain electrode 66, the data pad 68 and the conductor pattern for storage capacitor 64, also have the contact hole 74 for exposing the gate insulating film 30 and the gate pad 24. In this regard, like the first embodiment, the low dielectric insulating film 73 is removed from the pad portion to expose the passivation film 70, and the borderline of the passivation film or the gate insulating film as the lower insulating film is exposed in the contact holes 72 and 76, and so the sidewalls of the contact holes 72 and 76 have the step-shaped.

On the low dielectric insulating film 73, a pixel electrode 82, which is applied with image signals from the thin film transistor to generate an electric field in cooperation with electrodes in the upper plate, are formed. The pixel electrode 82 is made of a transparent conducting material such as an IZO or an ITO, and is connected to the drain electrode 66 via the contact hole 76 to receive the image signals. The pixel electrode 82 also overlaps the adjacent gate line 22 and data line 62 to increase the aperture rate, however, alternately not. In addition, the pixel electrode 82 is connected to the conductor pattern for storage capacitor 64 via the contact hole 72 to transmit the image signals thereto. On the gate pad 24 and the data pad 68, the assistant gate pad 84 and the assistant data pad 88 connected thereto via the contact holes 74 and 78 each. These play a part in complementing the adhesivity of the pads 24 and 68 and external circuit devices and protecting the pads, whether these are applied or not is selective.

As described above, also in the thin film transistor array panel according to the second embodiment, the sidewalls have step-shaped structure by exposing the protecting film 70 as a lower insulating film, and since the passivation film 70 in the pad portion is exposed not to generate a under-cut structure in the contact portion, the pixel electrode 82, the assistant gate pad 84 and the assistant data pad 88 can be prevented from being disconnected. Moreover, the assistant gate pad 84 and the assistant data pad 88 are formed to the upper side of the passivation film 70.

Although the transparent ITO or IZO has been described as exemplary materials of the pixel electrode 82, opaque conducting materials may be used in case of reflective liquid crystal displays.

A method for manufacturing a thin film transistor for liquid crystal display having structures of FIG. 11 to FIG. 13 using four masks will be described in detail with reference to FIG. 11 to FIG. 13 and FIG. 14a to FIG. 20c.

Figure 14A:
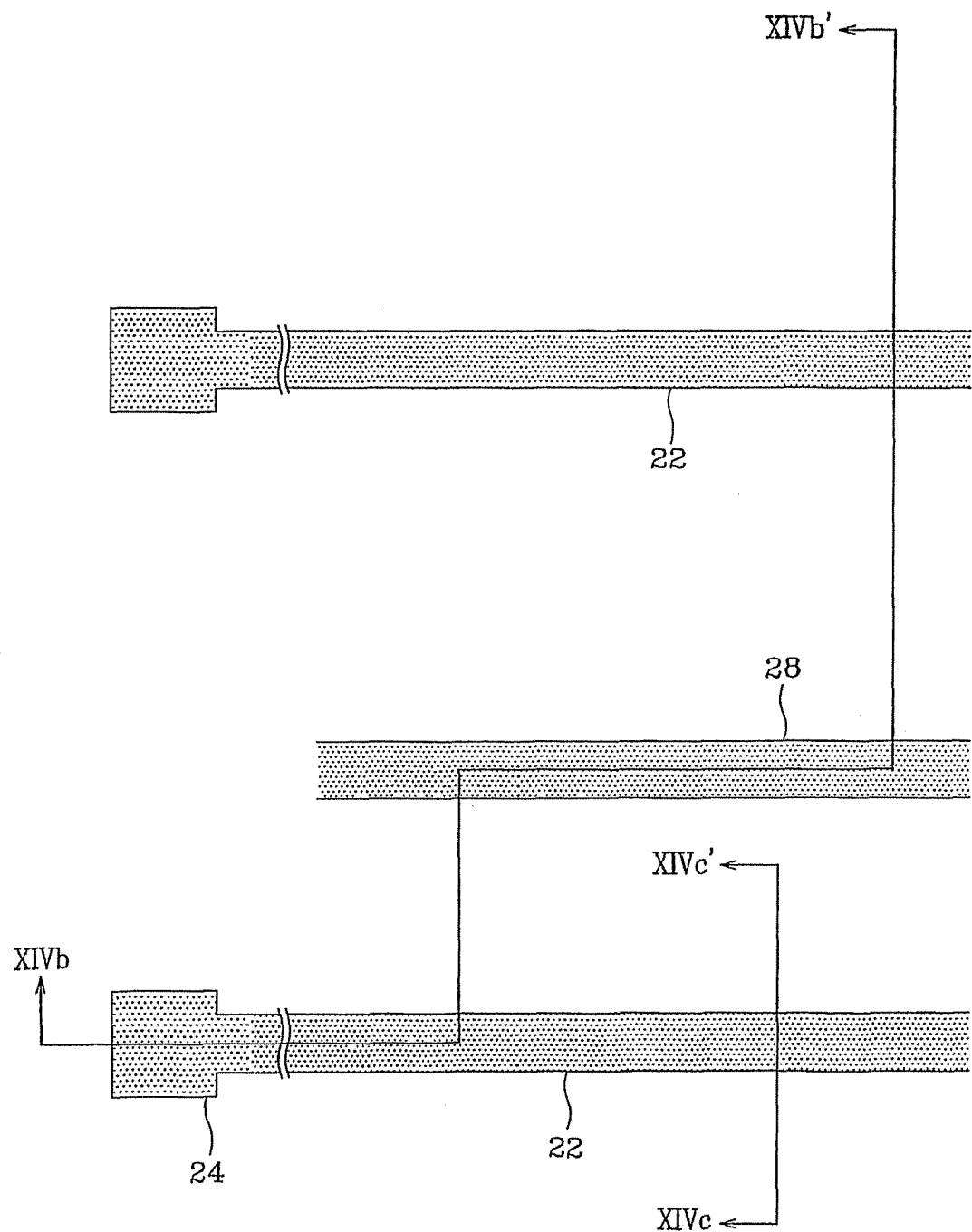
FIG. 14a is an arrangement view of thin film transistor in a first step, manufactured according to the second embodiment of the present invention.
Figure 14C:
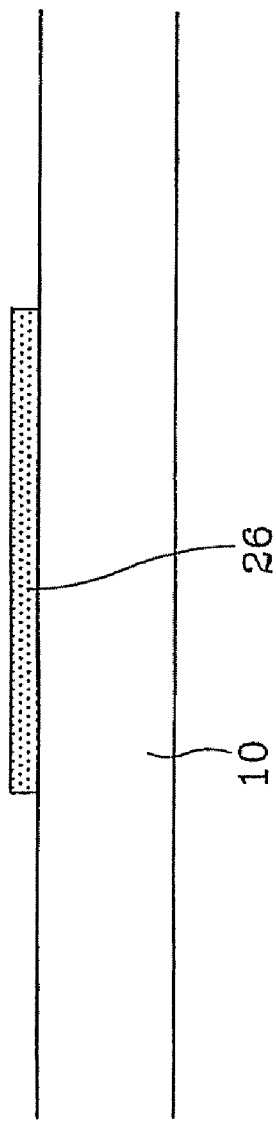

First, as shown in FIGS. 14a to 14c, in the same manner as the first embodiment, a conducting material for gate wire is deposited, and then the gate wire including a gate line 22, a gate pad 24, a gate electrode 26 and a storage electrode 28 are formed on a substrate 10 by a photo etching process using a first mask.

Figure 15A:
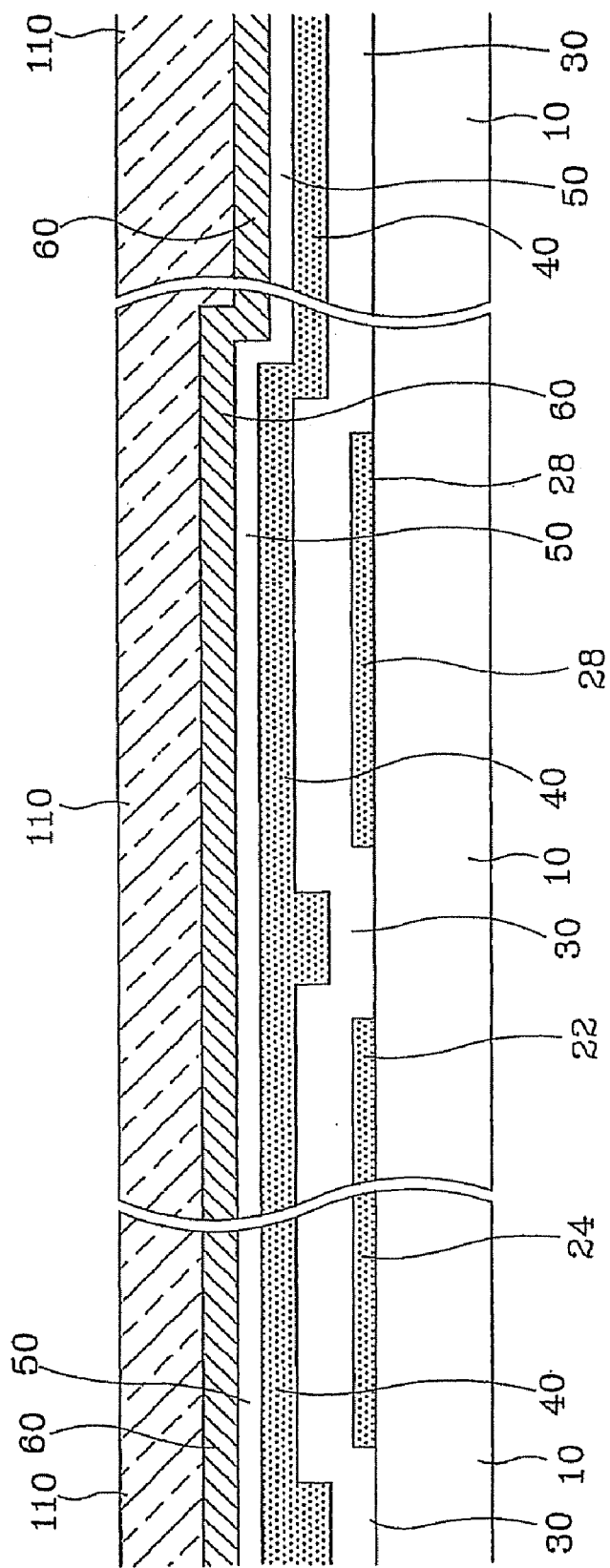
FIG. 15a and FIG. 15b are cross-sectional views taken along X IVb-X IVb' and X IVc-X IVc' shown in FIG. 14a, respectively, and shows next step of FIG. 14b and FIG. 14c.
Figure 15B:
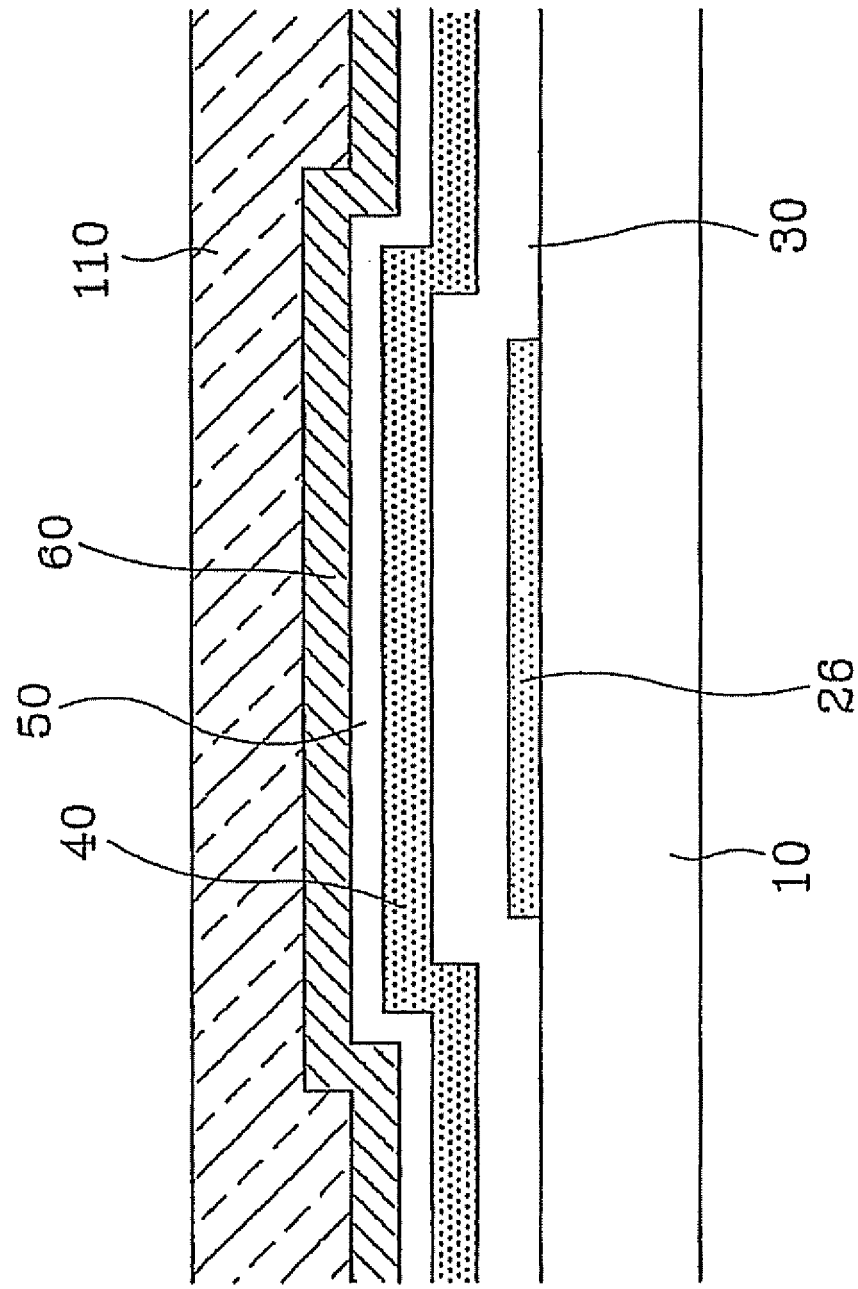

Next, as shown in FIGS. 15a and 15b, a gate insulating film 30, a semiconductor layer 40 and a middle layer 50 are deposited in succession 1,500 Å-5,000 Å, 500 Å-2,000 Å and 300 Å-600 Å thick, respectively, and then, a conductor layer 60 made of a conducting material for data wire with a low resistance is deposited 1,500 Å-3,000 Å thick by way of a sputtering, etc., and thereafter, a photosensitive film 110 is coated 1 μm-2 μm thick thereon.

Figure 16A:
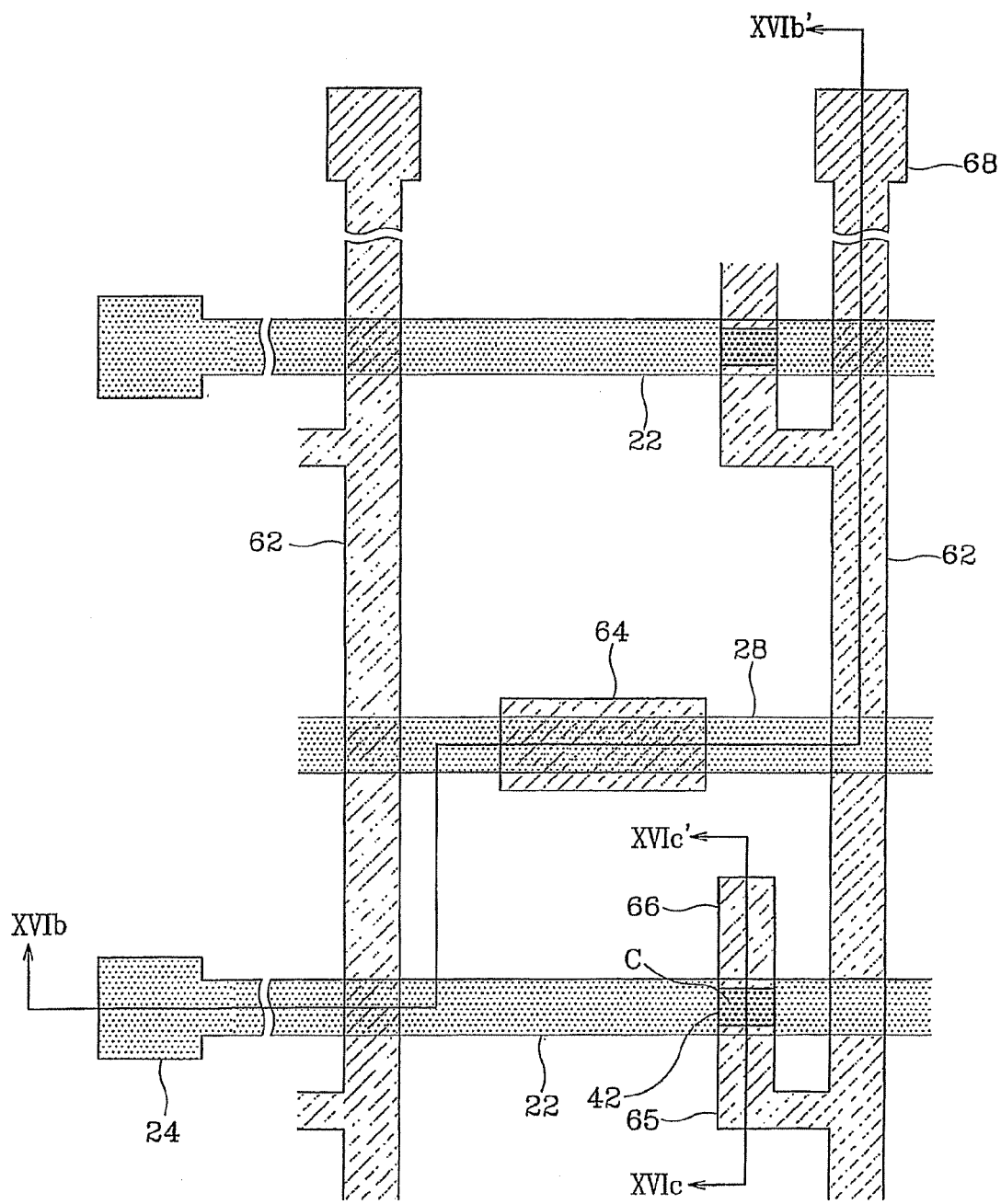
FIG. 16a is an arrangement view of thin film transistor of next step of FIG. 15a and FIG. 15b.
Figure 16B:
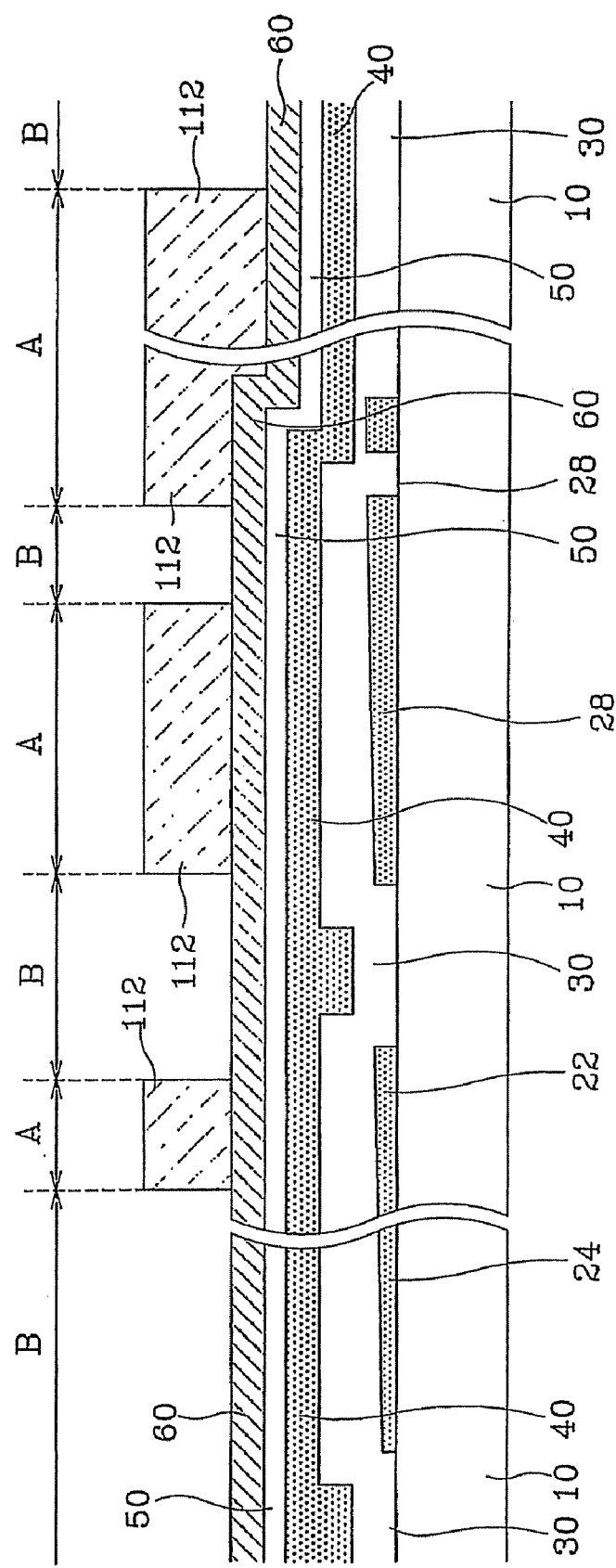
FIG. 16b and FIG. 16c are cross-sectional views taken along X VIb-X VIb' and X VIc-X VIc' shown in FIG. 16a, respectively.
Figure 16C:
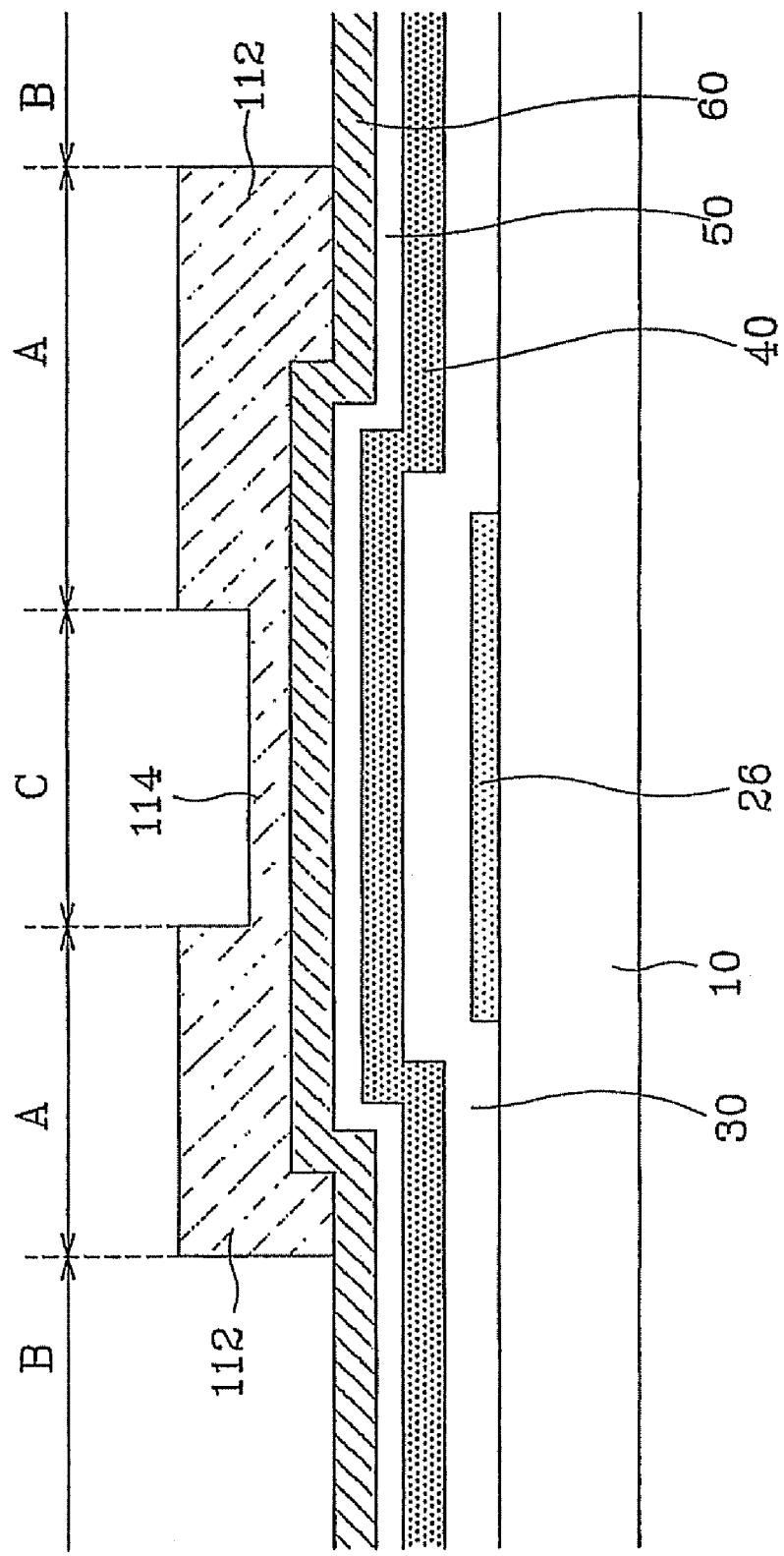

Then, after a light is irradiated to the photosensitive film 110 through a second mask and developed, the photosensitive patterns 112 and 114 are formed as shown in FIGS. 16b and 16c. The channel portion C of thin film transistor of the photosensitive film patterns 112 and 114, i.e., the first portion 114 posed between the source electrode 65 and the drain electrode 66 is made to be thinner than the data wire portion A, i.e., the second portion 112 posed in the portion where the data wire 62, 64, 66 and 68 will be formed, and all the photosensitive films in the other portions are removed. Here, the ratio of the thickness of the photosensitive film 114 left in the channel portion C and that of the photosensitive film 112 left in the data wire portion A are made to be varied depending on a process condition of etching process described later, and it is preferable that the thickness of the first portion 114 is less than a half, for example, less than 4,000 Å of that of the second portion 112.

As above, there may be several methods for varying the thickness of the photosensitive film depending on positions, and the pattern of a slit type or a lattice type is formed on the mask, or, the semi-transmittance area is formed thereon by using a semi-transparent film, in order to adjust an amount of a light transmittance in an area A. Of course, this method is equally applicable to the case that the organic insulating film (75, see FIG. 7) around the contact holes 72, 74, 76 and 78 is formed thinner than that in the other portions, and it is preferable that its thickness is adjusted in consideration of an ashing process.

In this regard, it is preferable that a line width of the patterns or an interval of the pattern placed among the slits, that is, the width of the slit is smaller than a resolution used at exposure, in case of using a semi-transparent film, thin films with different transmittances or different thickness may be used to adjust the transmittance on manufacturing masks.

When a light is irradiated to the photosensitive film through such masks, high molecules in the portion exposed directly to the light are completely decomposed, and high molecules in the portion where the slit pattern or the semi-transparent film is formed are not completely decomposed because an amount of a light irradiation is smaller, and high molecules in the portion blocked by a light-shield film is hardly decomposed. Next, when the photosensitive film is developed, the portion where the high molecules are not decomposed is left, and the portion where the light is irradiated a little is left thinner than that in the portion where the light is not irradiated at all. Here, since the molecules all are decomposed in case exposure time is made to be long, it is necessary not to do so.

A photosensitive film made of a material capable of reflowing is used and exposed with a mask whose portions transmitting a light completely and not transmitting a light completely is divided, and then, developed and reflowed to make part of the photosensitive film flow to the portion where the photosensitive film does not remain, and consequently, such thinner photosensitive film 114 may be formed.

Next, the photosensitive film 114 and the lower films thereof, i.e., the conductor layer 60, the middle layer 50 and the semiconductor layer 40 are etched. In this case, the data wire and the lower film is thereof have to be left the same in the data wire portion A, only the semiconductor layer has to be left in the channel portion C, and the above three layers 60, 50 and 40 all have to be removed to expose the gate insulating film 30 in the other portions B.

Figure 17A:
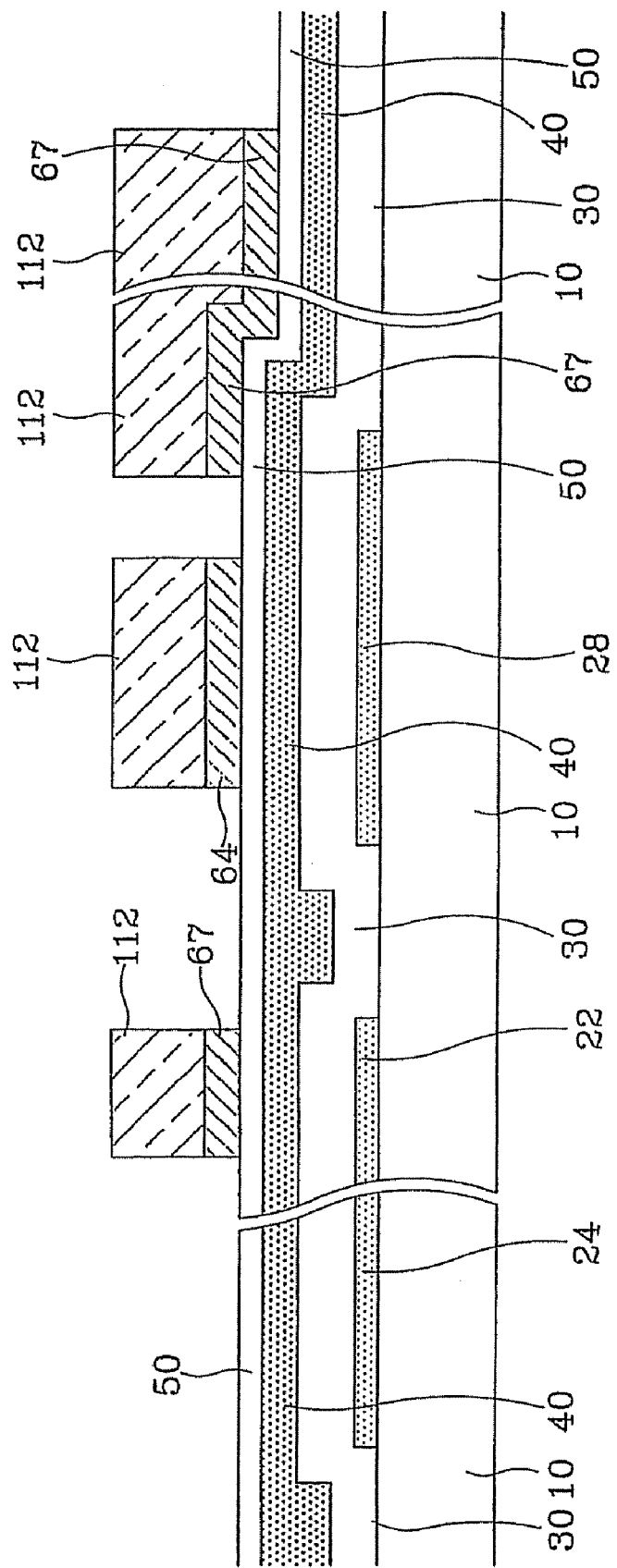
FIGS. 17a, 18a, 19a and FIGS. 17b, 18b, 19b are cross-sectional views taken along X VIb-X VIb' and X VIc-X VIc' and shown in FIG. 16, respectively, and show next step of FIG. 16b and FIG. 16c by a process order.
Figure 17B:
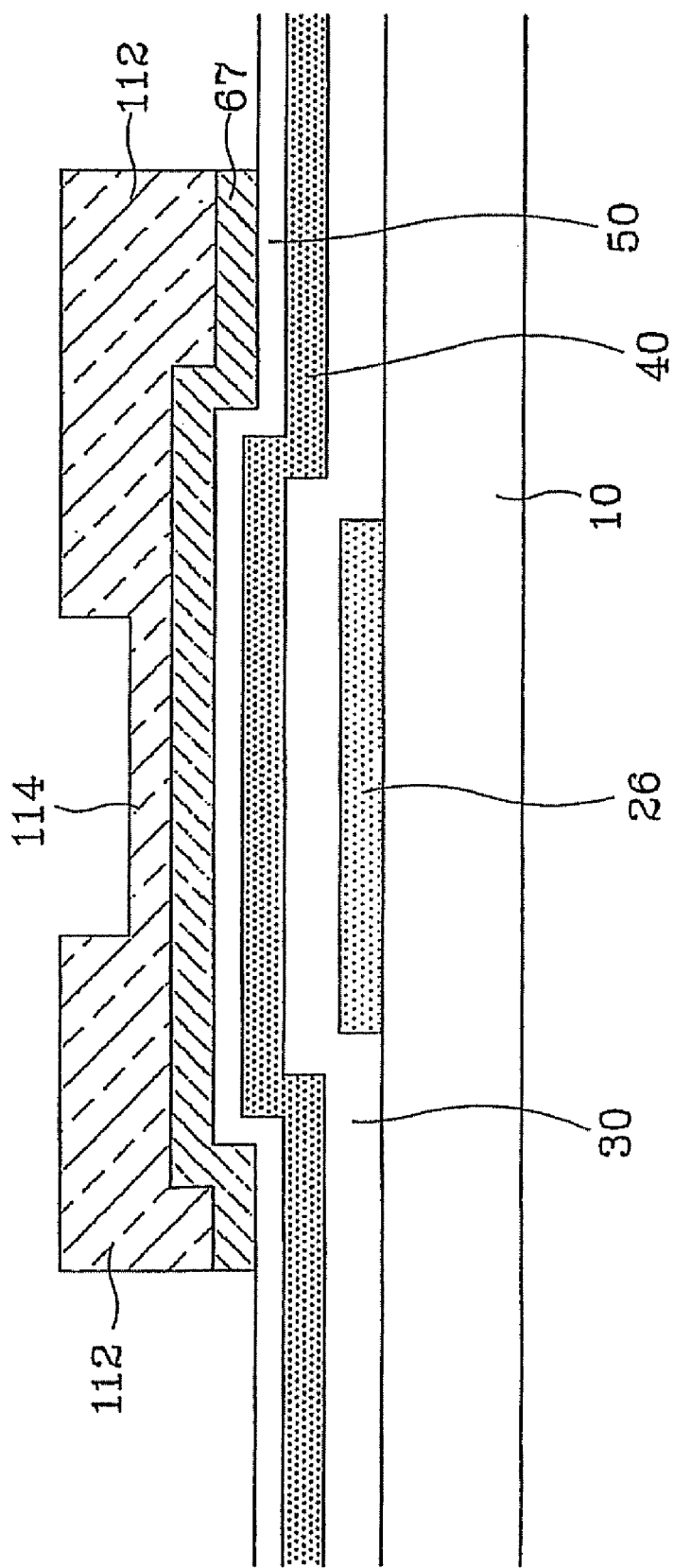

First, as shown in FIGS. 17a and 17b, the conductor layer 60 exposed in the other portions B is removed to expose the middle layer 50 thereof. Both a dry etching and a wet etching are used in this process, and here, they are preferably performed under the condition that the conductor layer 60 is etched and the photosensitive film patterns 112 and 114 are hardly etched. However, it is not easy that the condition, which only the conductor layer 60 is etched and the photosensitive film patterns 112 and 114 is not etched, is found in the dry etching, and therefore it may be performed under the condition that the photosensitive patterns 112 and 114 are etched, too. In this case, the first portion 114 is made to be thicker than in the wet etching, and hence it has to be prevented that the first portion 114 is so removed that the lower conductor layer 60 is exposed.

Here, in case that the conducting material for data wire is Al or Al alloy, either will do of the dry etching and the wet etching. However, in case of Cr, since the first portion 114 is not removed well, the wet etching had better be used, and $CeNHO_3$ is used as an etchant, and also the dry etching may be used when Cr is deposited very thinly to an extent of 500 Å thick.

In this way, as shown in FIG. 17a and FIG. 17b, the conductor layer 60 in the channel portion C and the data wire B, that is, only the conductor pattern for source/drain 67 and the conductor pattern for storage capacitor 64 are left and the conductor pattern 60 in the other portions B are removed to expose the middle layer 50 thereof. Here, the remaining conductor patterns 67 and 64 are the same forms as the data wire 62, 64, 65, 66 and 68 except the point that the source electrode 65 and the drain electrode 66 are not disconnected but connected. Furthermore, when the dry etching is used, the photosensitive patterns 112 and 114 are etched to some extent of thickness.

Figure 18A:
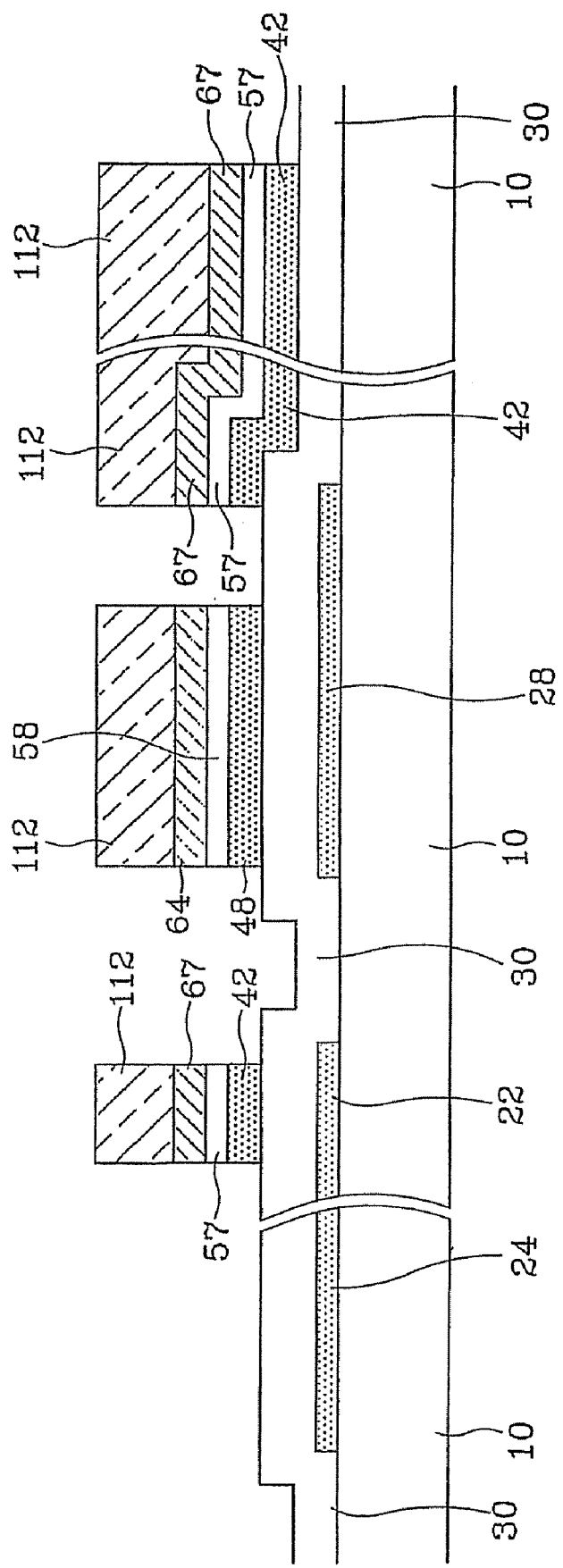
Figure 18B:
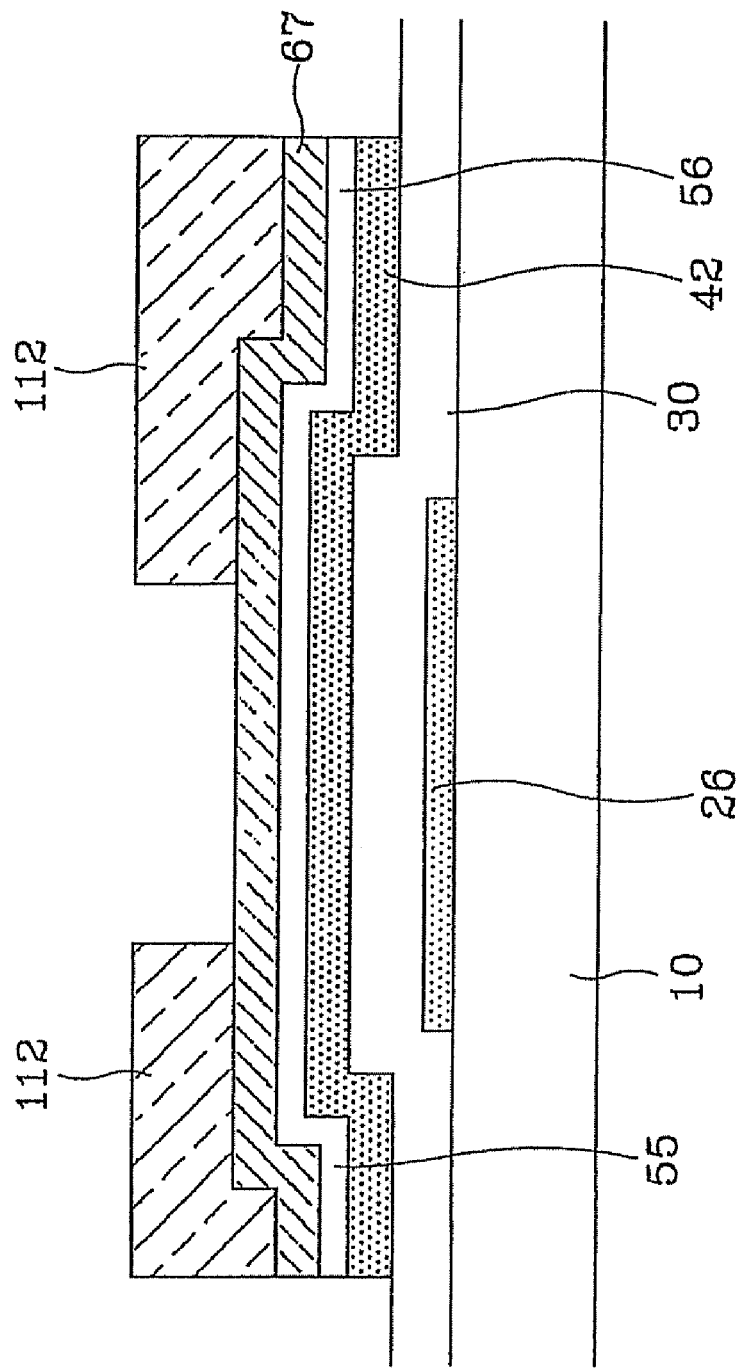

Next, as shown in FIG. 18a and FIG. 18b, the exposed middle layer 50 and the lower semiconductor layer 40 thereof in the other portions B are simultaneously removed with the first portion by a dry etching. When the conductor pattern 67 is etched by a dry etching, the middle layer 50 and the semiconductor layer 40 are sequentially etched by a dry etching, which is proceeded with an in-situ. The etching of the middle layer 50 and the semiconductor layer 40 should be performed under the condition that the photosensitive film patterns 112 and 114, the middle layer 50 and the semiconductor layer 40

(the middle layer and the semiconductor layer hardly have etching selectivity) are simultaneously etched and the gate insulating film 30 is not etched, especially it is preferable that the etching ratio of the photosensitive film patterns 112 and 114 and the semiconductor pattern 40 is almost the same condition. When the ratio of the photosensitive film patterns 112 and 114 and the semiconductor pattern 40 is the same, the thickness of the first portion 114 is the same as, or less than the sum of that of the semiconductor layer 40 and the middle layer 50.

In this way, as shown in FIGS. 18a and 18b, the conductor layers in the channel portion C and the data wire B, that is, only the conductor pattern for source/drain 67 and the conductor pattern for storage capacitor 64 is left and the conductor layers 60 in the other portions B all are removed. Furthermore, the first portion 114 in the channel portion C is removed to expose the conductor pattern for source/drain, and the middle layer 50 and the semiconductor layers 40 in the other portions B are removed to expose the lower gate insulating film 30 thereof. In the meanwhile, the second portion 112 in the data wire A is also etched, and hence it becomes thinner. Moreover, the conductor patterns 42 and 48 are completed in this procedure.

The reference numerals 57 and 58 indicate the lower middle layer pattern of the conductor pattern for source/drain 67 and the lower middle layer pattern of the conductor pattern for storage capacitor 64, respectively. Here, the conductor pattern for source/drain in the channel portion C may be exposed by a separate PR etch bade process, and, under the condition that a photosensitive film is etched sufficiently, the PR etch back process may be omitted.

Then, photosensitive film remnants left in the surface of the conductor pattern for source/drain in the channel portion C are removed through an ashing process.

Figure 19A:
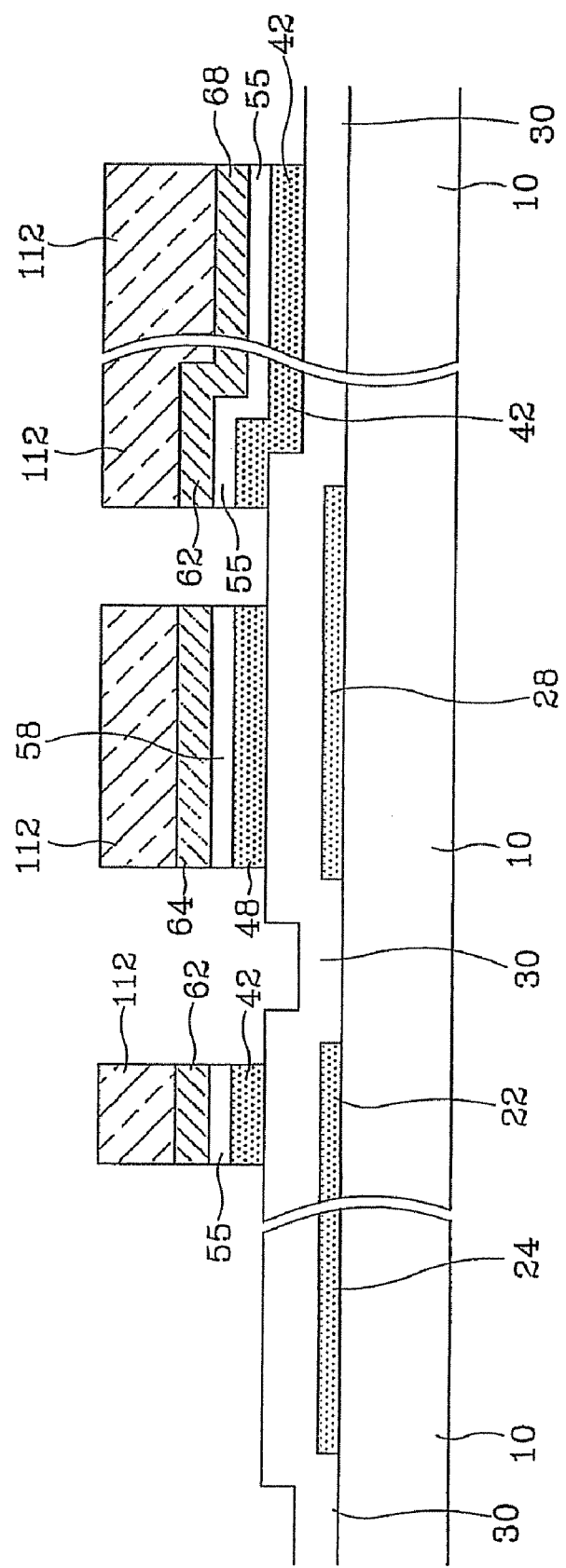
Figure 19B:
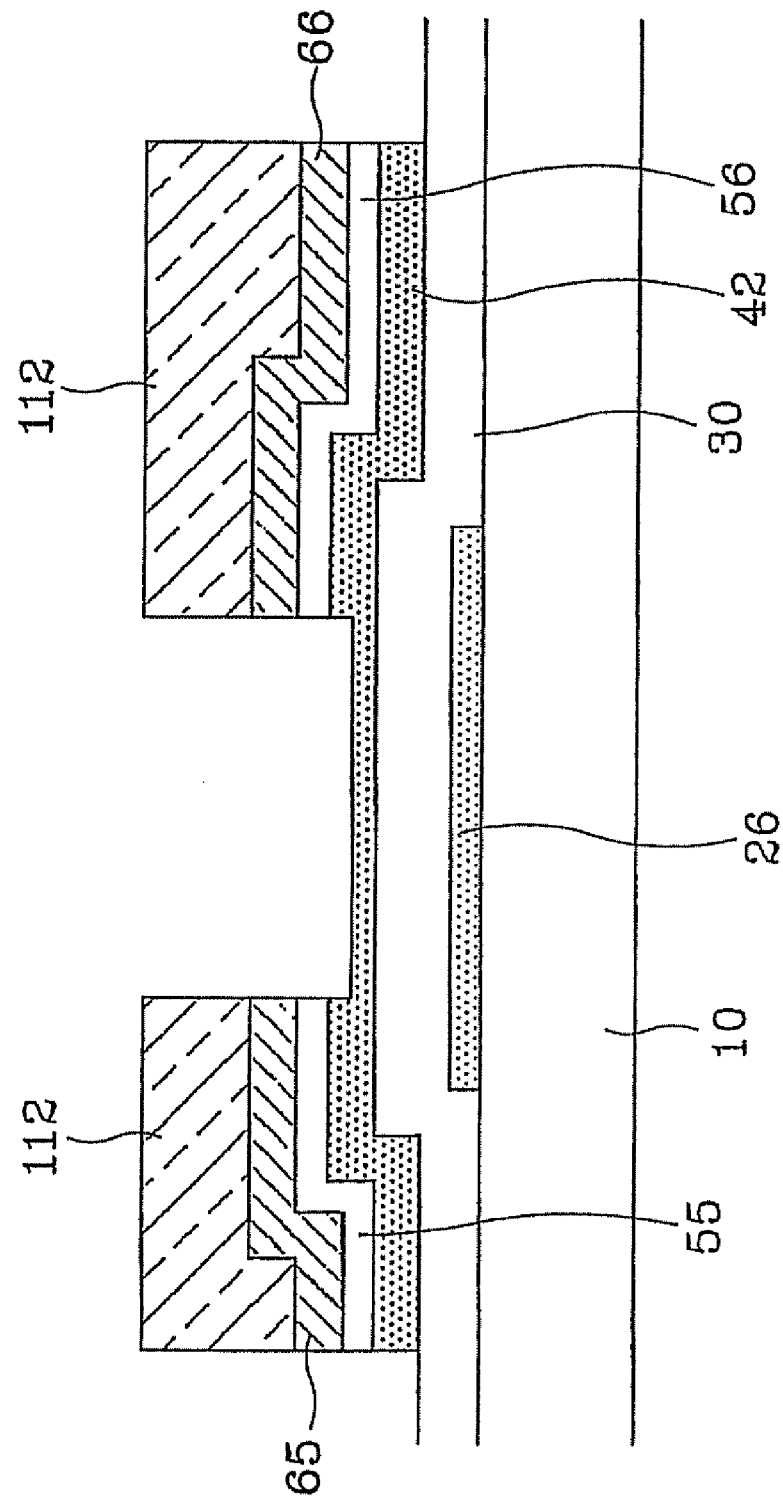

Next, as shown in FIGS. 19a and 19b, the conductor pattern for source/drain 67 and the lower middle pattern for source/drain 57 thereof in the channel portion C are etched to be removed. Here, the etching of both of them may be done using only a dry etching, the conductor pattern for source/drain is etched by a wet etching, and the middle layer pattern 57 is etched by a dry etching. In this regard, as shown in FIG. 15, part of the semiconductor pattern 42 is removed and thus its thickness becomes smaller, and here, the second portion 112 of the photosensitive film pattern is also etched to some extent of thickness. This etching is performed under the condition that the gate insulating film 30 is not etched, and it is preferable that the photosensitive film pattern is thick so that the second portion 12 is etched not to expose the lower data wire 62, 64, 65, 66 and 68 thereof.

In this way, while the source electrode 65 and the drain electrode 66 are isolated, the data wire 62, 64, 65, 66 and 68 and the contact layer patterns 55, 56 and 58 thereof are completed.

Finally, the second portion 112 of the photosensitive film left in the data wiring portion A is removed. However, the second portion 112 may be removed after the conductor pattern 67 for source/drain in the channel portion C is removed and before the lower middle layer pattern 57 thereof is removed.

Figure 20A:
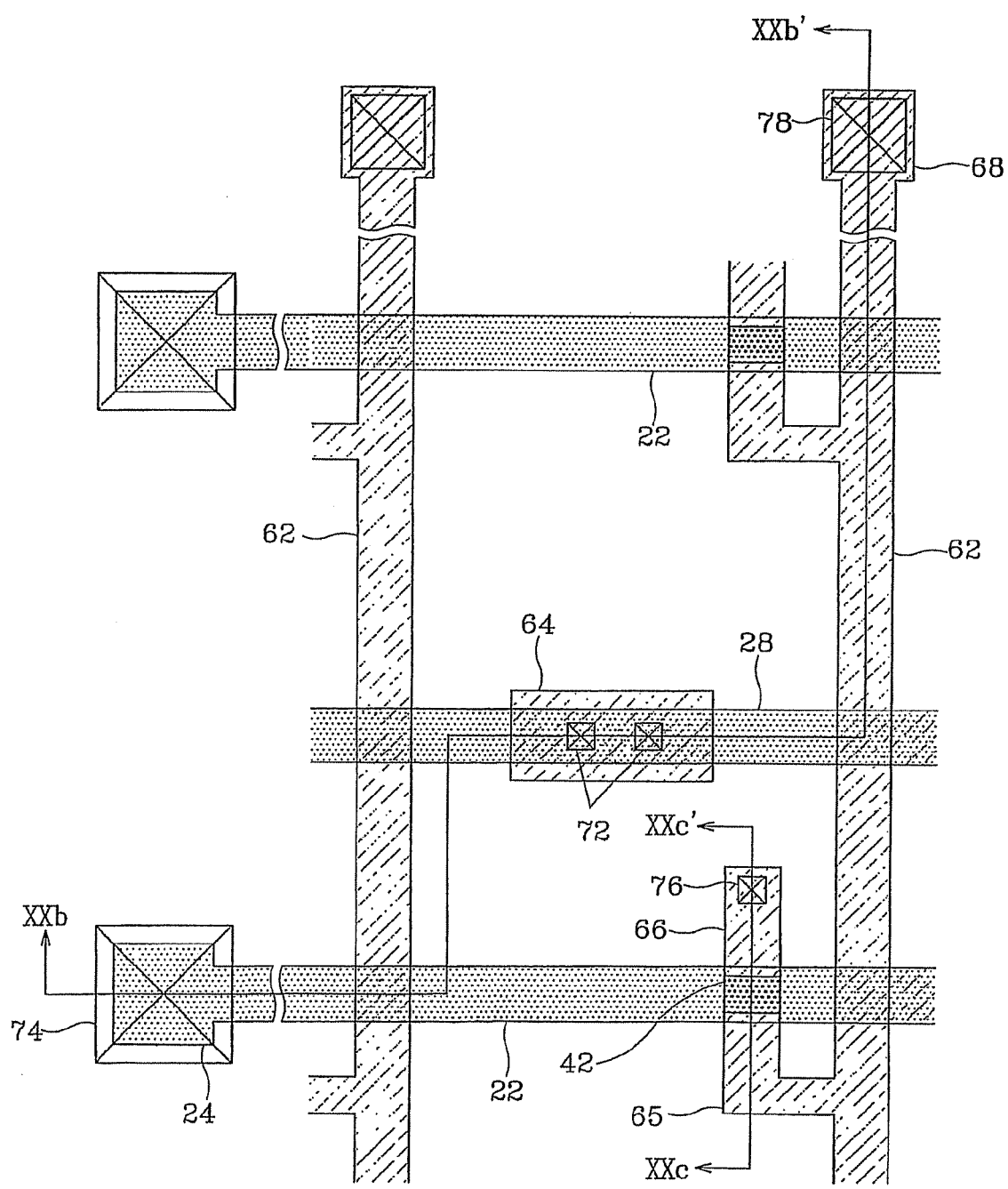
FIG. 20a is an arrangement view of thin film transistor in next step of FIG. 19a and FIG. 19b.
Figure 20B:
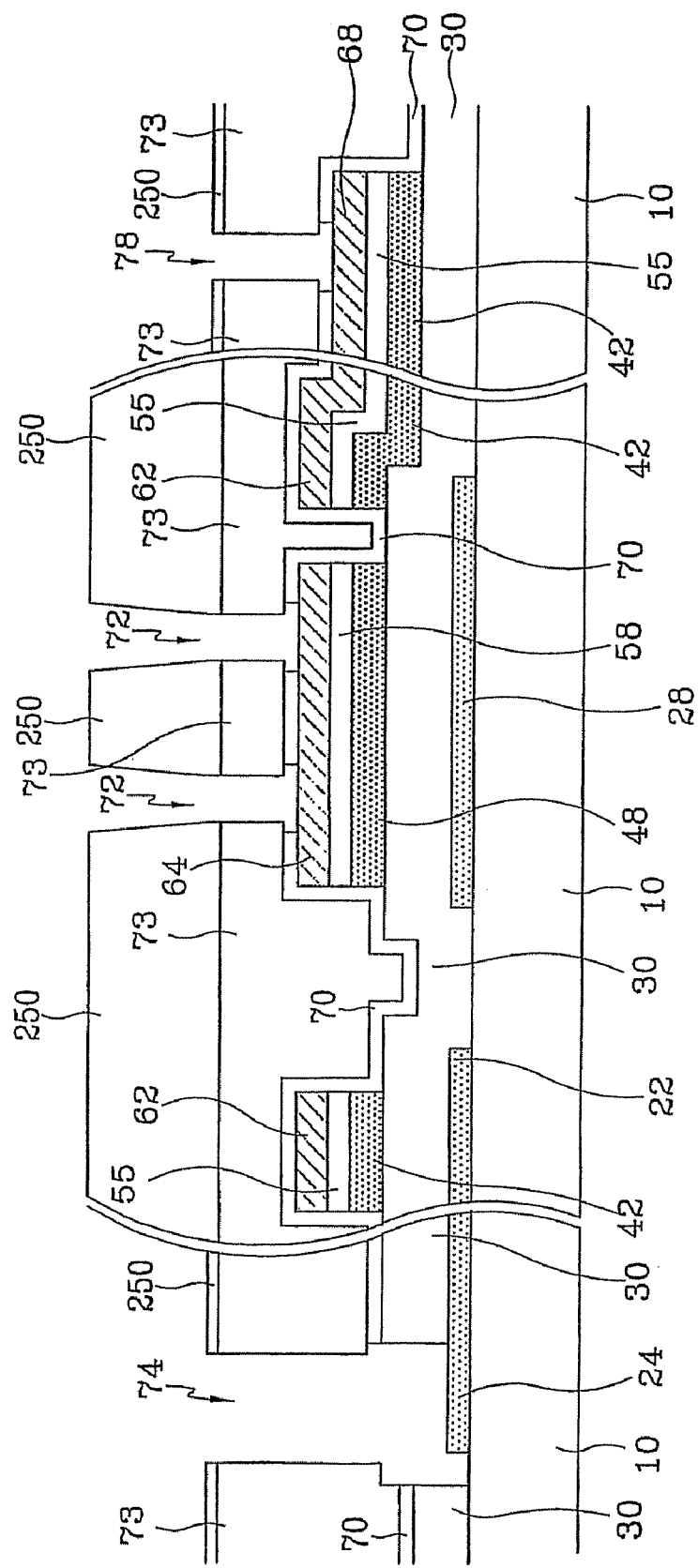
FIG. 20b and FIG. 20c are cross-sectional views taken along X X b-X X b', and shown in FIG. 20a, respectively.
Figure 20C:
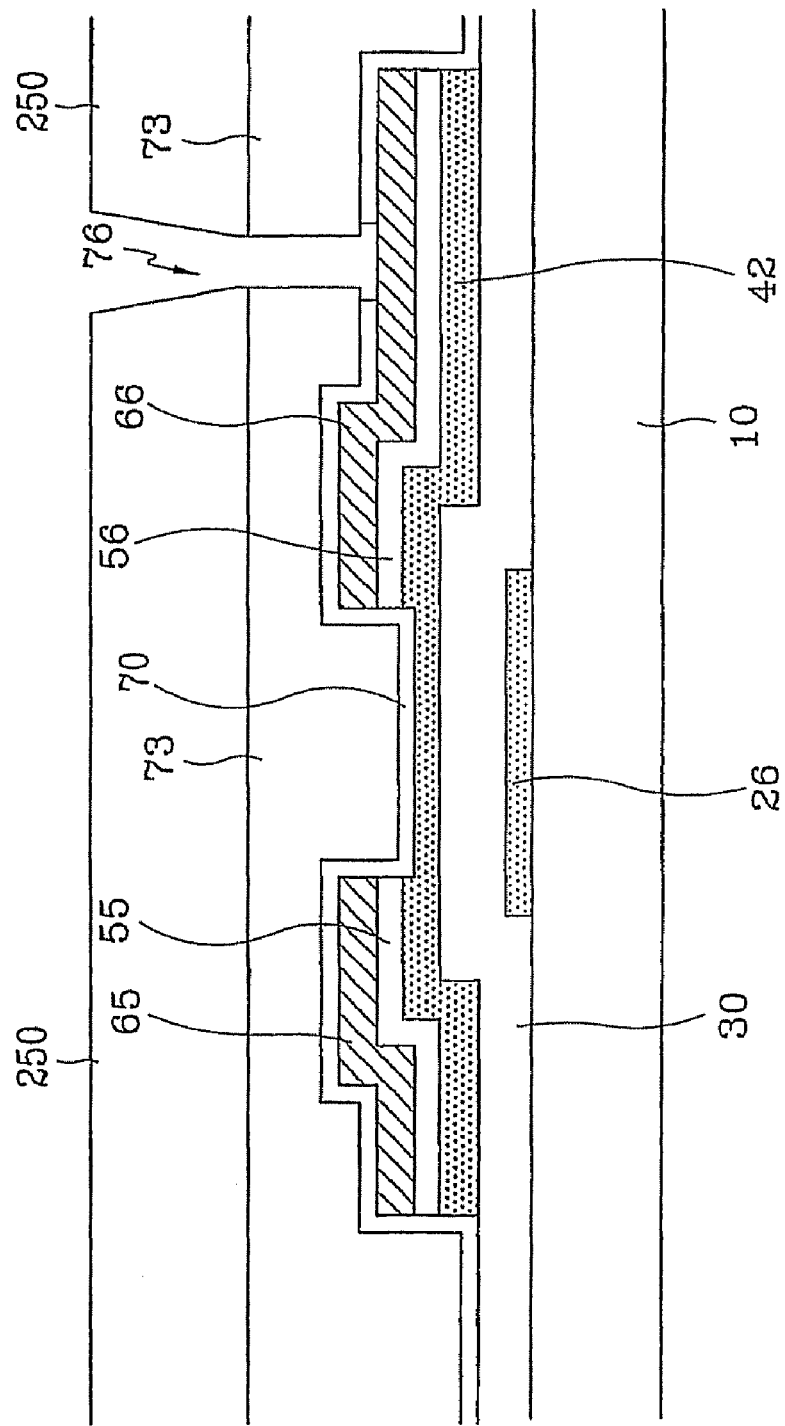

After the data wire 62, 64, 65, 66 and 68 are formed in such way, as shown in FIG. 20a to FIG. 20c, SiNx is deposited by a chemical vapor deposition to form the passivation layer 70, and SiOC or SiOF with a low dielectric constant which is less than 4.0 is deposited thereon by a chemical vapor deposition to form the low dielectric insulating film 73. Next, after an organic insulating film is formed on the low dielectric insulating film 73 by a spin coating, it is exposed and developed using a third mask to form the photosensitive pattern 250, and, by using this as an etching mask, the contact holes 72, 74, 76 and 78 for exposing the conductor pattern for storage capacitor 64, the gate pad 24, the drain electrode 66 and the data pad 68 are formed. Also in this regard, the passivation film 70 and the gate insulating film 30 are etched to the lower side of the low dielectric insulating film 73 to generate an under-cut in the contact portion, and as in the method for manufacturing the semiconductor device according to the second embodiment, in order to remove this, the photosensitive film pattern 250 in the pad portion around the contact holes 74 and 78 at least is formed thinner than that in the other portions. Of course, the photosensitive film pattern may be formed a step-shaped so that the thickness around the contact holes 72 and 74 also become thinner by forming slit patterns on the mask.

Figure 21A:
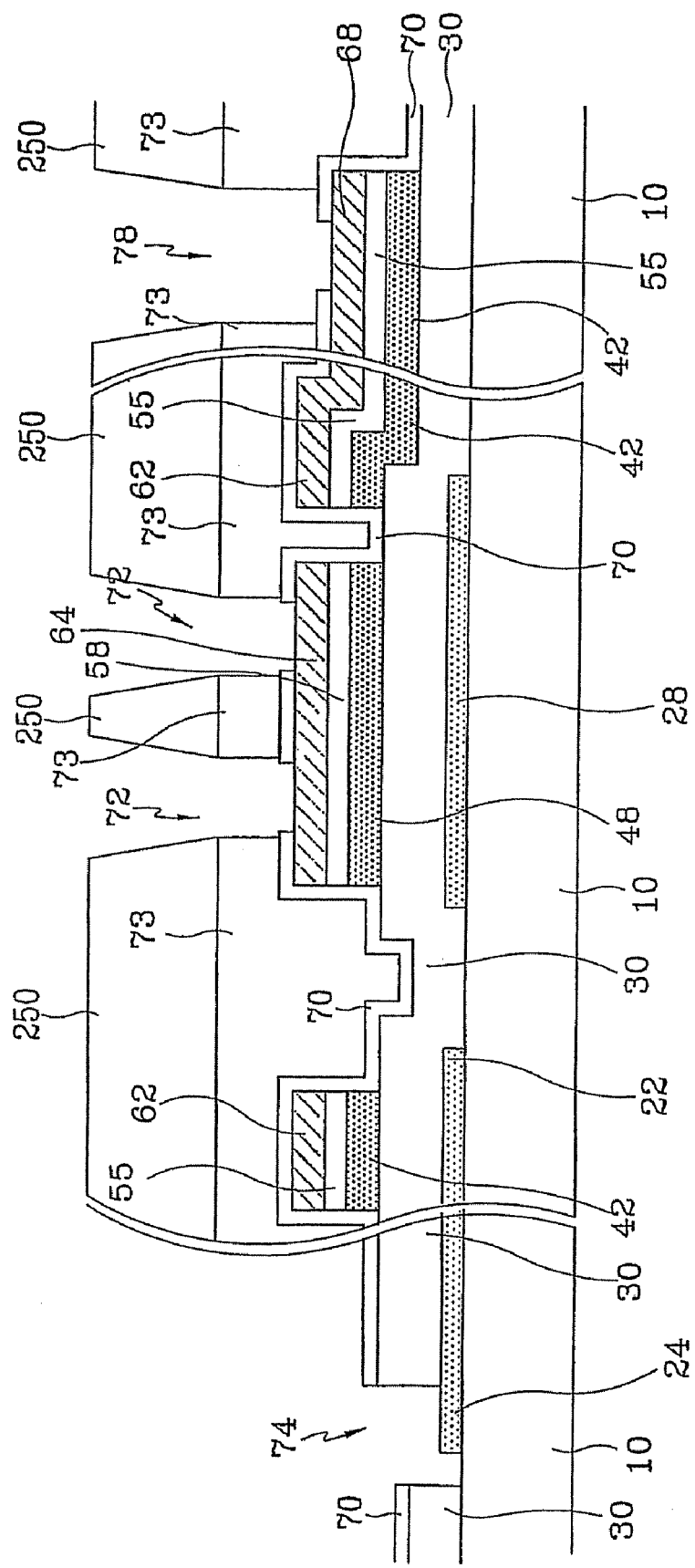
FIG. 21a and FIG. 21b are cross-sectional views taken along X X b-X X b' and X X c-X Xc' and shown in FIG. 20a, respectively, and show next step of FIGS. 20b and 20c by a process order.
Figure 21B:
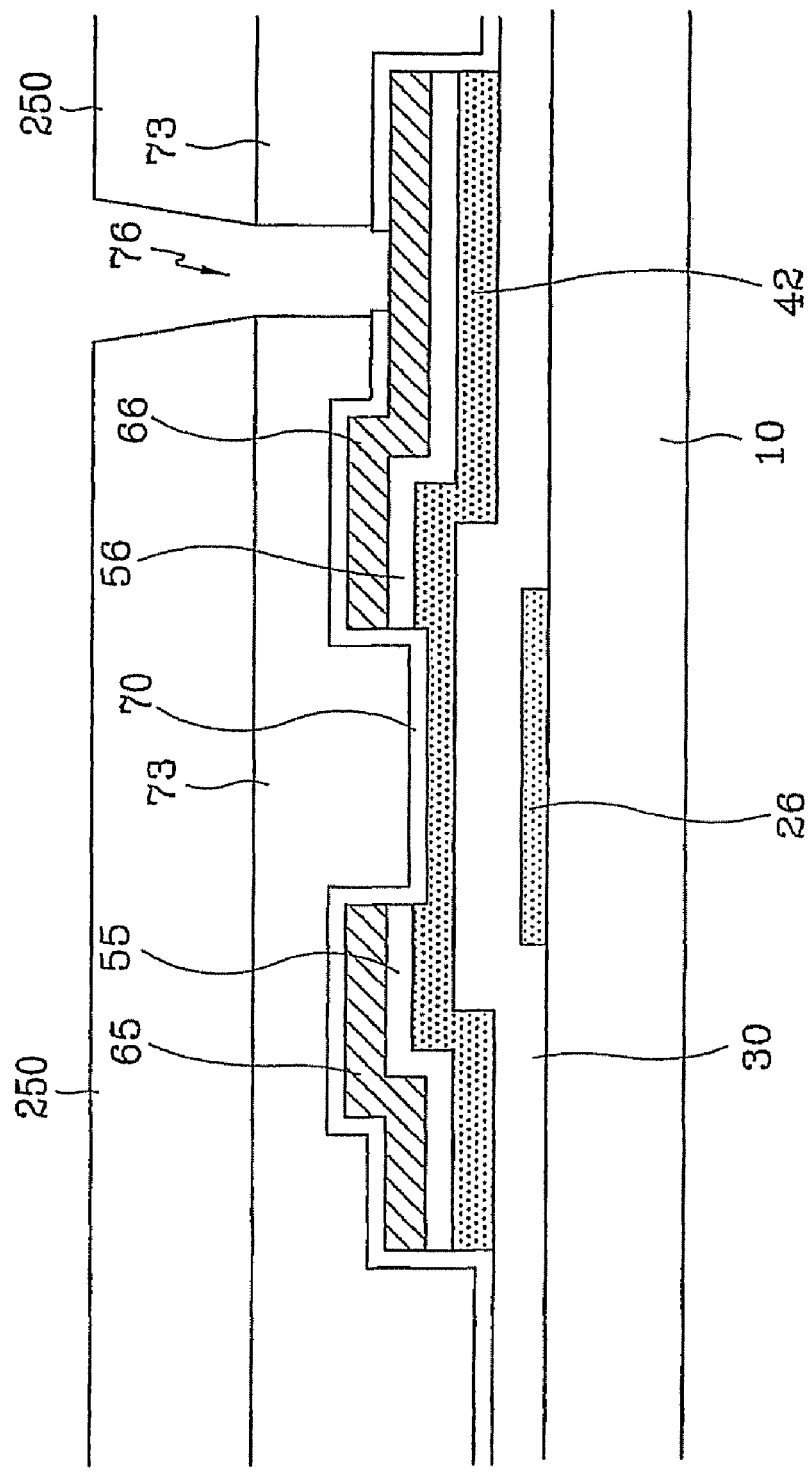

Next, as shown in FIGS. 21a and b, a thin photosensitive film formed around the contact holes 74 and 78 is removed by performing an ashing process to remove some thickness of the photosensitive film, and thereafter, a low dielectric insulating film 73, which is exposed using the photosensitive pattern 250 as an etching mask, is etched. Then, as shown in FIGS. 21a and b, the passivation film 70 is exposed in the pad portion. In the ashing process, part of the photosensitive film over the contact holes 72 and 76 is removed to expose the borderline of the low dielectric insulating film 73 defining the contact holes 72 and 76. If the low dielectric insulating film 73 is etched using the photosensitive pattern as an etching mask, the under-cut structure is removed on the sidewalls of the contact holes 72 and 76, as shown in figures. Here, it is preferable to use a dry etching, and the etching condition having an etching selectivity between the passivation film 70 and the low dielectric insulating film 73 should be applied. A gas mixed a fluorine-substituted-gas such as $SF_6^+O_2$, $CR_4^+O_2$ or $C_2F_6^+O_2$ with oxygen may be used as an etching gas and its composition ratio is variable depending on the forming condition of the low dielectric insulating film 73.

Finally, after the photosensitive film pattern is removed, as shown in FIGS. 11 to 13, ITO or IZO having the thickness of 400 Å to 500 Å is deposited, and etched using the fourth mask to form a pixel electrode 82 connected to the conductor pattern for storage capacitor pattern 64, an assistant gate pad 84 connected the gate pad 24 and an assistant data pad 88 connected to the data pad 68.

The second embodiment of this present invention not only has the effect according to the first embodiment but also can make the manufacturing process simplified by forming the data wire 62, 64, 65, 66 and 68, the lower contact layer pattern 55, 56 and 58 thereof and the semiconductor pattern 42 and 48 using one mask and by isolating the source electrode 65 and the drain electrode 66 in this process. Of course, also in the method for manufacturing the thin film transistor panel for liquid crystal display according to the second embodiment, a photosensitive film pattern is formed thin on a portion where a seal line will be formed and the low dielectric insulating film 73 in the portion is removed to expose the passivation film 70.

In the thin film transistor panel for liquid crystal display manufactured through such manufacturing process, as described above, a pad portion and a driving integrated circuit may be electrically connected by a TCP or COF manner which the driving integrated circuit is packed on a film, or by a COG manner which a driving integrated circuit is directly mounted on a substrate.

As above, according to the present invention, by forming the photosensitive film around the contact holes thinner than the other portions on under-cutting the lower film in the contact portion, then, performing an ashing to expose the border of the lower insulating film in the contact portion, and hence forming the sidewall of the contact hole as a step-shaped, the under-cut can be removed in the contact portion. Through this, the display feature can be improved by preventing a disconnection generated in the contact portion to secure reliability thereof, and the manufacturing process cab be simplified and the manufacturing cost can be reduced by minimizing the photo etching process to manufacture the thin film transistor for liquid crystal display. Furthermore, the poor contact between two panels for liquid crystal display can be improved by removing the organic film in the portion where the seal line will be formed.

What is claimed is:

1. A semiconductor device comprising:
    a substrate;
    a first wire formed on the substrate;
    a lower insulating film covering the first wire and having first contact holes for exposing the first wire;
    an upper insulating film formed on the lower insulating film and having second contact holes for exposing the first contact holes and upper surfaces of portions of the lower insulating film adjacent to borderlines defining the first contact holes; and
    a second wire formed on the upper insulating film and connected to the first wire via the first contact holes and the second contact holes, the second wire comprising a transparent material,
    wherein the lower insulating film is formed of an inorganic film, and the upper insulating film is formed of an organic insulating film or low dielectric insulating film, which has a dielectric constant of less than 4.0.

2. The device of claim 1, wherein a pixel region is defined by the gate line and the data line, and the second interlayer of the adjacent pixel regions includes different materials.

3. A semiconductor device comprising:
    a substrate;
    a gate line formed on the substrate;
    a gate insulation layer covering the gate line;
    a semiconductor formed on the gate insulation layer;
    a data line intersecting with the gate line and formed on the gate insulation layer and a part of the semiconductor;
    a drain electrode separated from the data line;
    a first interlayer covering the data line and the drain electrode and including a first contact hole, the first interlayer being formed of an inorganic layer;
    a second interlayer formed on the first interlayer and including a second contact hole, the second interlayer being formed of an organic insulating film or a low dielectric insulating film, which has a dielectric constant of less than 4.0; and
    a transparent electrode formed on the second interlayer,
    wherein the first contact hole and the second contact hole expose the drain electrode and the second contact hole is wider than the first contact hole, the second contact hole exposes a portion of an upper surface of the first interlayer, and
    the transparent electrode is electrically connected to the drain electrode through the first contact hole and the second contact hole.

4. The device of claim 3, wherein the first interlayer is made of SiNx.

5. The device of claim 3, wherein the transparent electrode also contacts lateral surfaces and the upper surfaces of portions of the first interlayer adjacent to borderlines defining the first contact hole.

6. A semiconductor device comprising:
    a substrate;
    a first wire formed on the substrate;
    a lower insulating film covering the first wire and having first contact holes for exposing the first wire;
    an upper insulating film formed on the lower insulating film and having second contact holes for exposing the first contact holes and upper surfaces of portions of the lower insulating film adjacent to borderlines defining the first contact holes; and
    a second wire formed on the upper insulating film and connected to the first wire via the first contact holes and the second contact holes, the second wire comprising a transparent material,
    wherein the lower insulating film is formed of an inorganic film, and the upper insulating film is formed of an organic insulating film or a low dielectric insulating film which has a dielectric constant of less than 4.0, and
    wherein the semiconductor device has a portion wherein a seal line for sealing a liquid crystal material is formed, and the upper insulating film is removed from the portion so that the seal directly contacts with the lower insulating film.

* * * * *